US008583412B2

(12) United States Patent
Kolavi

(10) Patent No.: US 8,583,412 B2
(45) Date of Patent: Nov. 12, 2013

(54) SYSTEMS AND METHODS FOR PROVIDING A SIMULATION ENVIRONMENT HAVING A SIMULATION USER INTERFACE

(75) Inventor: Shashi Kumar M. Kolavi, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 966 days.

(21) Appl. No.: 12/266,267

(22) Filed: Nov. 6, 2008

(65) Prior Publication Data
US 2010/0114549 A1    May 6, 2010

(51) Int. Cl.
G06G 7/62    (2006.01)
G06G 7/66    (2006.01)

(52) U.S. Cl.
USPC .......................................................... 703/13

(58) Field of Classification Search
None
See application file for complete search history.

(56) References Cited

U.S. PATENT DOCUMENTS

| 6,044,305 A * | 3/2000 | Larson et al. ............. 700/87 |
| 2004/0078182 A1* | 4/2004 | Nixon et al. ............. 703/22 |
| 2004/0117166 A1 | 6/2004 | Cassiolato |
| 2008/0177396 A1 | 7/2008 | Hansen |

FOREIGN PATENT DOCUMENTS

WO    WO2004-031874 A1    4/2004

OTHER PUBLICATIONS

Tomita et al. "Fieldbus System Engineering", 1999, Yokogawa Technical Report English Edition, No. 28, pp. 20-24.*
Emerson Process Management. "Answers to your Questions about Implementing Fieldbus in DeltaV systems", Mar. 2007, 17 pages.*
Rosemount, "Foundation Fieldbus Blocks Product Manual", 2000, 102 pages.*
Pantoni et al., Integration of an Open and Non-Proprietary Device Description Technology in a Foundation Fieldbus Simulator, Proc. of WFCS 2008, pp. 435-444, Aug. 30, 2008.
"Foundation Specification Function Block Application Process", Part 1, pp. 1-148, Fieldbus Foundation, Dec. 1, 2005 (only title page, foreword, table of contents and p. 73 are submitted).
"Technical Overview", Fieldbus Foundation, pp. 1-37, (1996 (Rev. 1996, 2003)) (only title page, preface, table of contents and pp. 9 and 10 are submitted).

* cited by examiner

*Primary Examiner* — Suzanne Lo
(74) *Attorney, Agent, or Firm* — Jetter & Associates, P.A.

(57) ABSTRACT

Systems (200, 230, 240) and methods (700) for controlling a simulation of an operation of a Fieldbus system (100) comprising at least one FIM (114, 116) communicatively coupled to field devices (122, 124). The methods involve initiating a current simulation (CS) of an operation of the FIM and/or field devices. The methods also involve obtaining intermediate simulation information (ISI) indicating a status/progress of CS. The methods further involve displaying ISI to a user of a simulation system and displaying visual elements (610, ..., 620) for controlling the progress of CS to the user. Gantt charts (672, 674) for the FIM/field devices and visual content showing data exchanges between software elements and/or hardware elements of the simulation system can further be displayed to the user. The visual elements can facilitate speeding up CS, slowing down CS, moving the progress of CS backwards/forwards, and/or stopping/re-starting the CS.

20 Claims, 20 Drawing Sheets

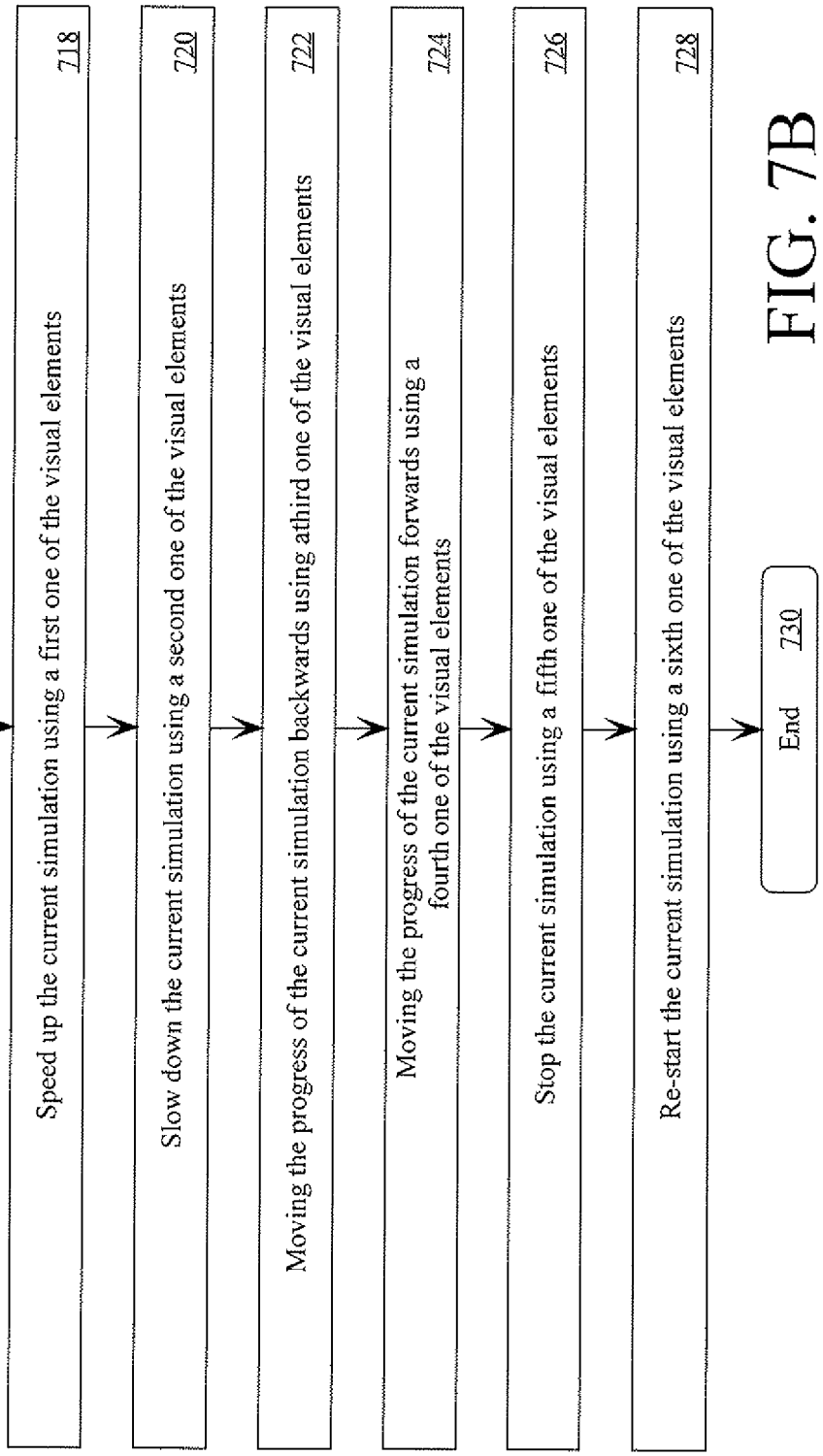

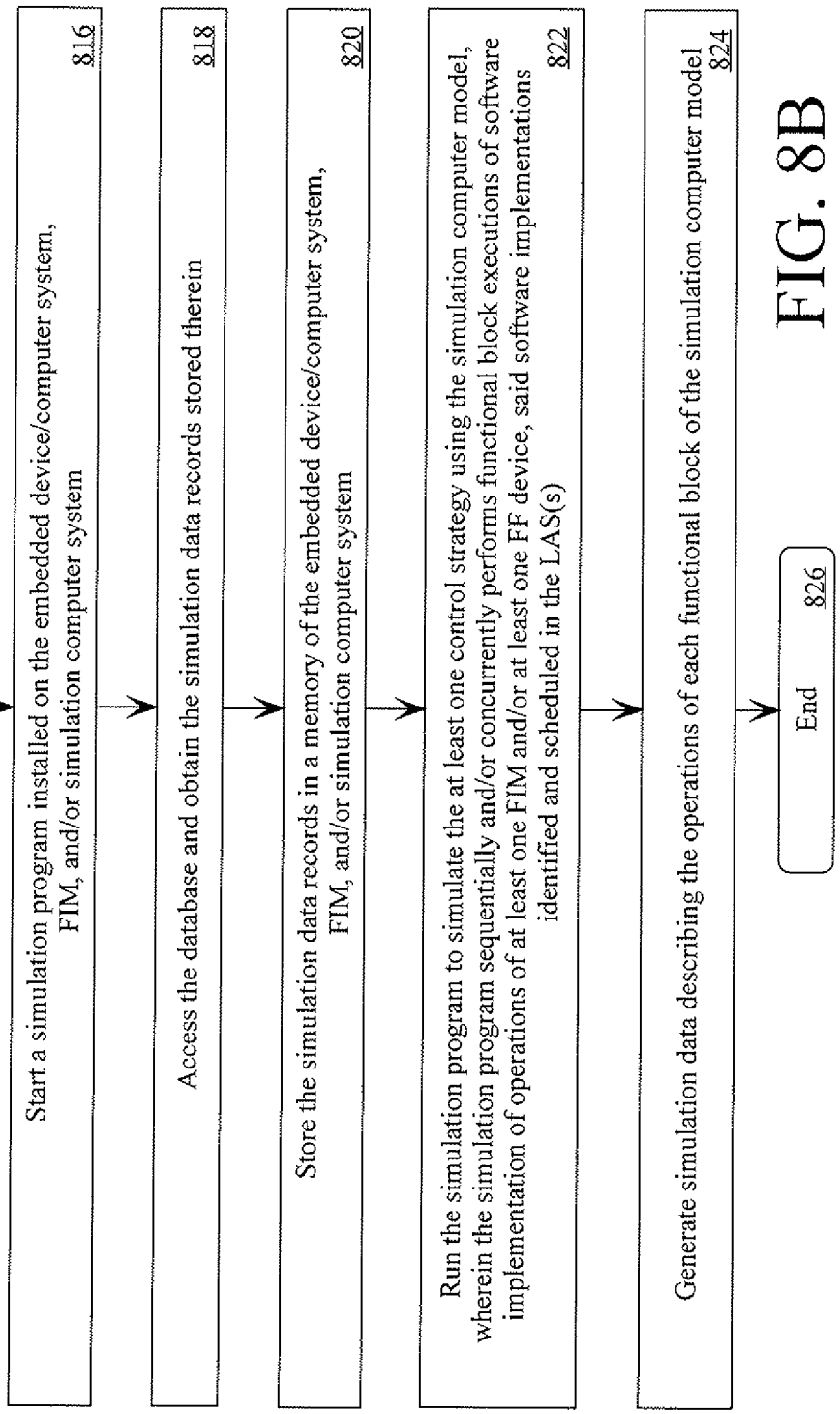

| Operation Identifiers 1002 | Operation Description 1004 |
|---|---|
| AI Operation (Performed by FF Device) | 1. Generate an analog input signal representing a sensed/measured value; and<br>2. Communicate the analog input signal from a sensor/gauge of an FF device to a processor of the FF device. |
| AIA_3 Operation (Performed by FF Device) | Process the analog input signal to place the sensed/measured value in an H1 link format suitable for communication from an FF device to a FIM over an H1 link. |
| AI.OUT Operation (Performed by FF Device) | Write the sensed/measured value in the H1 link format to an H1 link Buffer of the FF device. |
| AI_Agent Operation (Performed by FIM) | 1. Read the sensed/measured value from the H1 Buffer of the FF Device;<br>2. Process the sensed/measured value to place the same in a CCN format suitable for communications over a common communications network(CN); and<br>3. Write the sensed/measured value to a CCN buffer of a FIM. |
| PID_Agent Operation (Performed by FIM) | 1. Read control data from a CCN Buffer of a Main/Secondary Controller;<br>2. Process the control data to place the same in an H1 Link format suitable for communications over an H1 Link; and<br>3. Write the control data in the H1 Link format to an H1 buffer of a FIM. |
| AO Operation (Performed by FF Device) | 1. Read control data from the H1 Buffer of the Fieldbus Interface Module;<br>2. Process the control data and perform a particular event specified by the control data. |
| AO.BKOUT Operation (Performed by FF Device) | 1. Generate return data indicating that the particular event has occurred;<br>2. Process the return data to place the same in an H1 Link format suitable for communications over an H1 Link; and<br>3. Write the return data to an H1 buffer of an FF device. |

Table 1000

FIG. 10

IF FIM AND FF DEVICES SIMULATED:

| LINK ACTIVE SCHEDULE 1106₂ | |
|---|---|
| Software Operation Identifier | Timing Parameters |
| AI Operation | |
| AIA_3 Operation | |
| AI.OUT Operation | |
| AI_Agent Operation | t=0 |
| Wait for PID and PID.OUT Operations to be Performed by Main Controller | t=m 1310 1312 |
| PID_Agent Oper. | t=n t=p |
| AO Operation | t=q t=s |
| AO.BKOUT Oper. | t=r |

FIG. 13B

IF FF DEVICES SIMULATED:

| LINK ACTIVE SCHEDULE 1106₃ | |
|---|---|
| Software Operation Identifier | Timing Parameters |
| AI Operation | |
| AIA_3 Operation | |
| AI.OUT Operation | |
| Wait for AI_Agent Operation to be Performed by FIM | 1320 |
| Wait for PID and PID.OUT Operations to be Performed by Main Controller | 1322 |
| Wait for PID_Agent Operation to be Performed by FIM | 1324 |
| AO Operation | 1326 |
| AO.BKOUT Oper. | |

FIG. 13C

SYSTEMS AND METHODS FOR PROVIDING A SIMULATION ENVIRONMENT HAVING A SIMULATION USER INTERFACE

BACKGROUND

1. Statement of the Technical Field

The invention concerns control systems and methods for providing a simulation environment having a simulation user interface, wherein the simulation environment includes hardware and/or software configured for simulating Fieldbus devices.

2. Background

There are many industrial plant control systems (IPCSs) known in the art. One such IPCS is shown in FIG. 1. As shown in FIG. 1, the IPCS 100 is comprised of a control system 102, H1 links 126$_1$, 126$_2$, and Fieldbus Field (FF) devices 122, 124. The control system 102 typically has a distributed network configuration, i.e., there are application specific modules 104, 106, 108, 114, 116, 120 connected to each other and an operator computer system 112 via a common communications network 110. More specifically, the control system is comprised of a server 104, a database 106, a main controller 108, an operator computer system 112, a supervisory controller 120, and Fieldbus Interface Modules (FIMS) 114, 116. The listed devices 104, . . . , 108, 112, . . . , 116, 120 are communicatively connected to each other via the common communications network 110 (e.g., an Ethernet Network). As such, the devices 114, 116, 120 include common communications network (CCN) buffers 140, 142, 144. Each of the CCN buffers 140, 142, 144 includes memory used to temporarily store data before it is sent from a first device 114, 116, 120 to a second device 104, 106, 108, 112, . . . , 116, 120 over the common communications network 110.

The control system 102 is communicatively connected to the FF devices 122, 124 via the H1 links 126$_1$, 126$_2$. The phrase "H1 links", as used herein, refers to communications links defining an I/O network (e.g., a FOUNDATION FIELDBUS™ network). The phrase "FOUNDATION FIELDBUS™", as used herein, refers to an all-digital, serial, two-way communications system that serves as a network (e.g., a location area network) for industrial distributed network devices 104, . . . , 108, 112, . . . , 116, 120 and FF devices 122, 124. The FF devices 122, 124 include, but are not limited to, motors, pumps, gauges, valves, transmitters, actuators, boilers, distiller units, and sensors. Each of the FF devices 122, 124 can include an H1 link buffer 136 as shown in FIG. 1. Each of the H1 link buffers 136 is memory used to temporarily store data before it is sent from a first device to second device over an H1 link 126$_1$, 126$_2$. Similarly, each of the FIMS 114, 116 includes an H1 link buffer 130, 132.

Despite certain advantages of the conventional IPCS 100, it suffers from certain drawbacks. For example, the industrial equipment 122, 124 often includes a large number of devices. As such, it is impractical to use the actual IPCS system including all of the above listed devices for purposes of control strategy configuration, operator training, and Factory Acceptance Testing (FAT). For example, the FAT execution is difficult since a portion of the system control resides in the FF devices 122, 124. As such, it is logistically impossible to have thousands of FF devices 122, 124 shipped to a FAT facility and connected to a control network 102 to test a particular IPCS application. Further, if the actual FF devices 122, 124 are used in a FAT, then delays in the construction of the IPCS 100 on site may occur.

In view of the forgoing, there remains a need for a practical system and method that can facilitate control strategy configuration, operator training, and FAT. The system and method needs to be capable of simulating some or all of the network elements and Fieldbus devices of the IPCS 100. The system and method also needs to be capable of providing a user interface for displaying simulation specific content.

SUMMARY OF THE INVENTION

This Summary is provided to comply with 37 C.F.R. §1.73, presenting a summary of the invention briefly indicating the nature and substance of the invention. It is submitted with the understanding that it will not be used to interpret or limit the scope or meaning of the claims.

Embodiments of the present invention concern systems and methods for controlling a simulation being performed by a simulation system. The simulation is of an operation of a Fieldbus system. The Fieldbus system comprises at least one Fieldbus Interface Module (FIM) communicatively coupled to field devices. The methods involve initiating a current simulation of the operation of the Fieldbus system. The current simulation comprises sequential steps for simulating operations of the FIM. The methods also involve obtaining intermediate simulation information indicating a progress of the current simulation. The progress defines which steps of the sequential steps have been performed, are being performed, and are to be performed. The methods further involve communicating at least a portion of the intermediate simulation information to at least one user of the simulation system. The progress of the current simulation is controlled using at least one visual element of a computer display.

BRIEF DESCRIPTION OF THE DRAWINGS

Embodiments will be described with reference to the following drawing figures, in which like numerals represent like items throughout the figures, and in which:

FIGS. 7A-7B collectively provide a flow diagram of a method for monitoring and controlling a simulation of an operation of a Fieldbus system according to an embodiment of the invention.

FIGS. 8A-8B collectively provide a flow diagram of a method for simulating operations of a control system according to an embodiment of the invention.

FIG. 10 is a table listing exemplary operational identifiers and operation descriptions for operations performed by Fieldbus Interface Modules and Fieldbus Field devices.

FIGS. 13A-13C collectively provide schematic illustrations of exemplary Link Active Schedules according to embodiments of the invention.

DETAILED DESCRIPTION

Embodiments of the invention concern systems and methods for facilitating control strategy configuration, operator training, and Factory Acceptance Testing (FAT) of automated equipment control systems. More specifically, the systems implement methods for providing a simulation environment having a simulation user interface, wherein the simulation environment includes hardware and/or software configured for simulating Fieldbus devices. The methods can involve simulating at least a portion of the network elements and devices of a control system. The methods can further involve performing an event based execution of Fieldbus process control strategies.

Embodiments of the invention will now be described more fully hereinafter with reference to accompanying drawings, in which illustrative embodiments of the invention are shown. This invention, may however, be embodied in many different forms and should not be construed as limited to the embodiments set forth herein. For example, the present invention can be embodied as a method, a data processing system, or a computer program product. Accordingly, the present invention can take the form as an entirely hardware embodiment, an entirely software embodiment, or a hardware/software embodiment.

Before describing the systems and methods of the present invention, it will be helpful in understanding an exemplary environment in which the invention can be utilized. In this regard, it should be understood that the methods of the present invention can be utilized in any application where equipment is to be simulated. Such applications include, but are not limited to, industrial plant control applications, medical applications, security applications, and navigation applications. Accordingly, the methods of the present invention will now be described in relation to one such application, namely, the industrial plant control application.

Exemplary Simulation Systems

Figure 1:
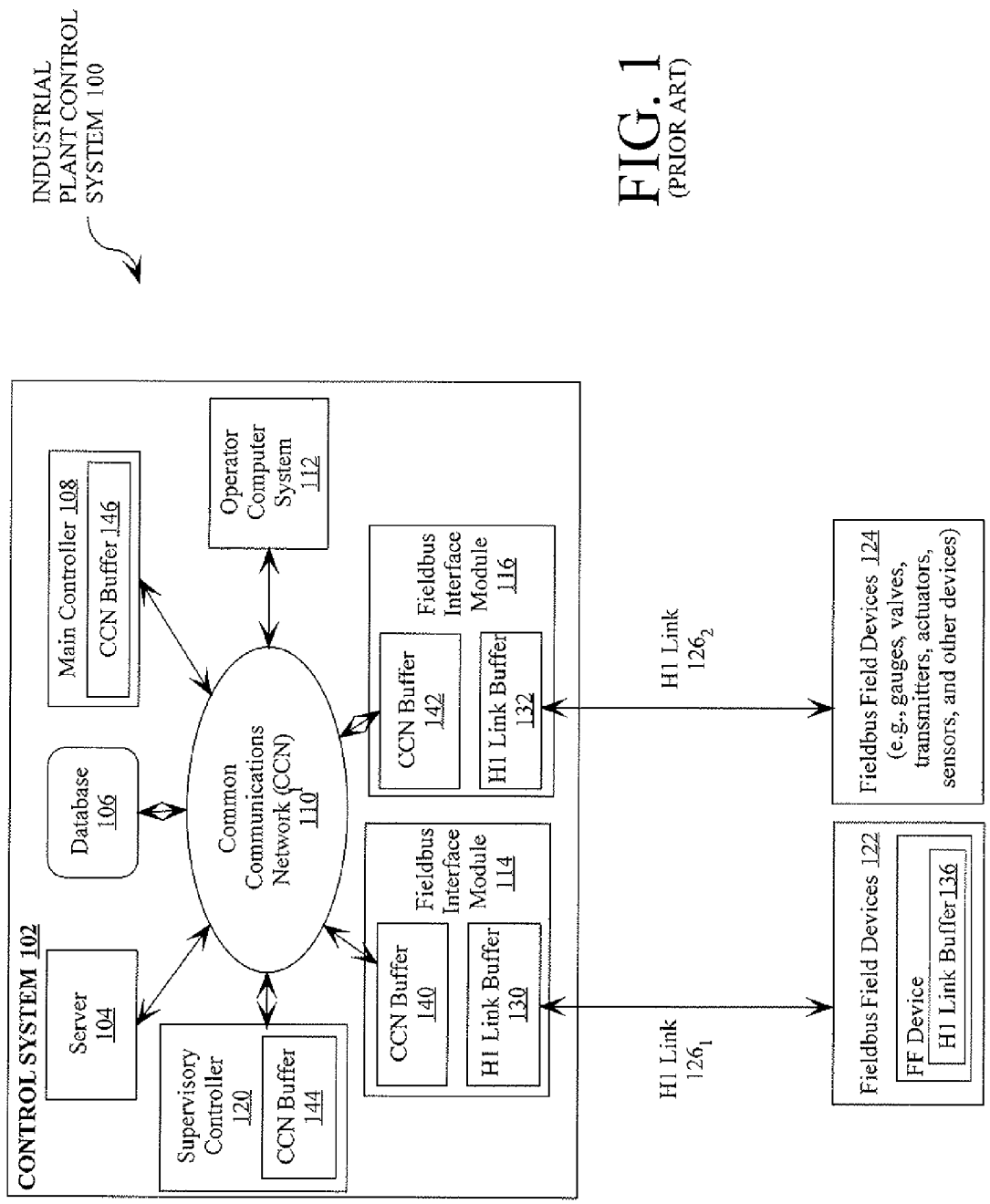
FIG. 1 is a block diagram of a conventional industrial plant control system.
Figure 2A:
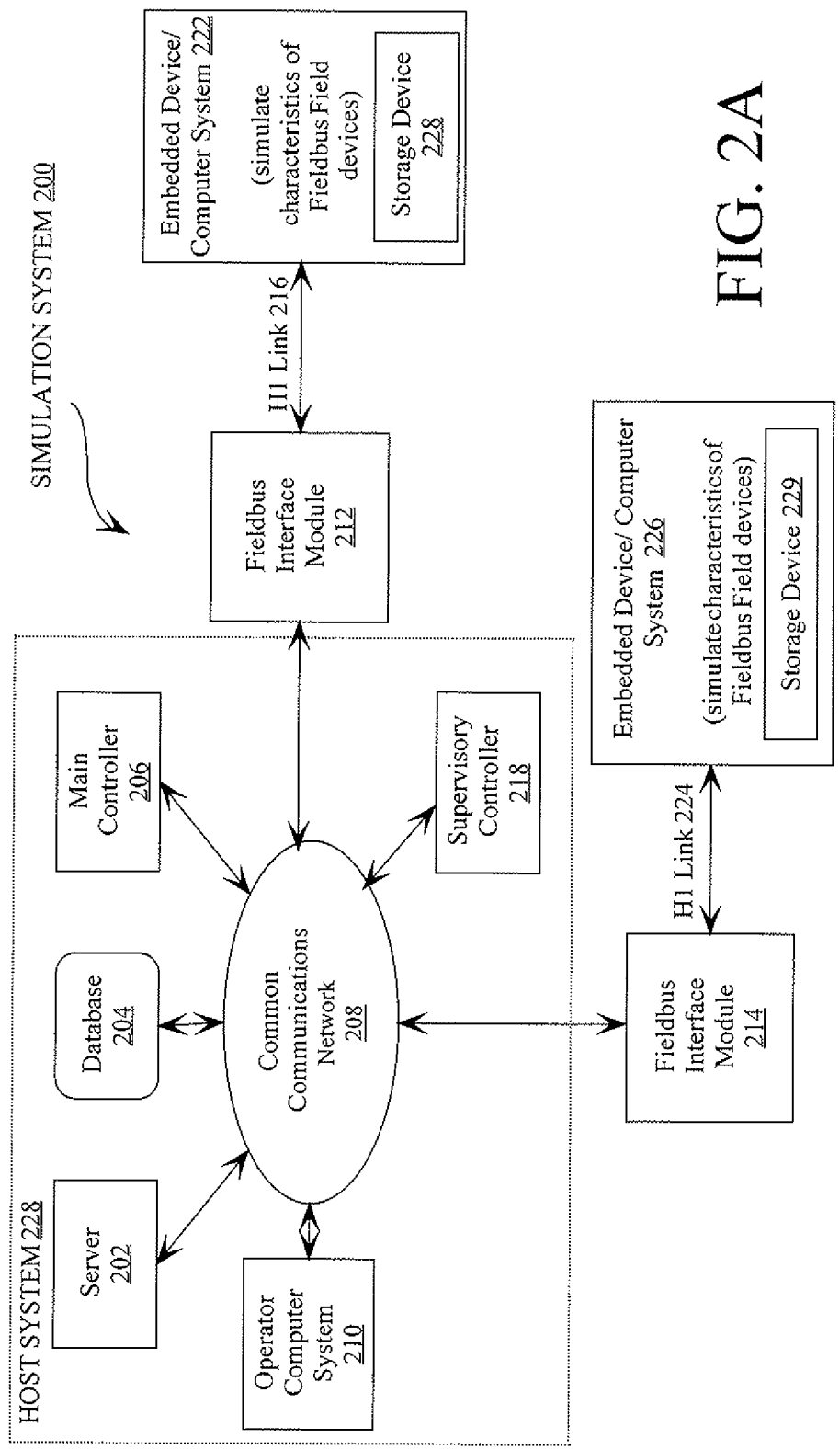
FIG. 2A is a bock diagram of a simulation system according to an embodiment of the invention.

Referring now to FIG. 2A, there is provided a block diagram of an exemplary simulation system 200 according to an embodiment of the invention. The simulation system 200 is configured for simulating the operations and control strategies of an IPCS (e.g., the IPCS 100 shown in FIG. 1). In this regard, it should be understood that the simulation system 200 is comprised of a host system 228, Fieldbus Interface Modules (FIMs) 212, 214, and embedded devices/computer systems (ED/CSs) 222, 226. The host system 228 is comprised of a server 202, a database 204, a main controller 206, an operator computer system (OCS) 210, and a supervisory controller 218. The simulation system 200 is also comprised of a common communications network 208 and H1 links 216, 224.

Each of the listed components 202, ..., 206, 210, 218 is well known to those having ordinary skill in the art, and therefore will not be described in detail herein. However, a brief discussion of the components 202, ..., 206, 210, 218 is provided to assist a reader in understanding the present invention.

The listed components 202, ..., 206, 210, 212, 214, 218 are communicatively coupled to each other via the common communications network 208. As such, each of the listed components 202, ..., 206, 210, 212, 214, 218 can comprise a common communications network (CCN) buffer (not shown). The CCN buffers (not shown) are not shown in FIG. 2A for purposes of simplicity. The CCN buffers (not shown) can be provided for temporally storing data before it is sent from a first device to a second device. The common communications network 208 can include an Ethernet network. The invention is not limited in this regard. The common communications network 208 can be any type of network selected in accordance with a particular automation process application.

OCS 210 can be configured to facilitate control strategy configuration, operator training, and FAT of automated equipment. OCS 210 is typically a desktop personal computer system, a laptop personal computer system, a personal digital assistant, a wireless computing device, or any other general purpose computer processing device. Accordingly, OCS 210 includes a user interface (not shown) and a processing device (not shown). The user interface (not shown) often comprises a keyboard (not shown), a mouse (not shown), a display screen (not shown), and the like.

Figure 3:
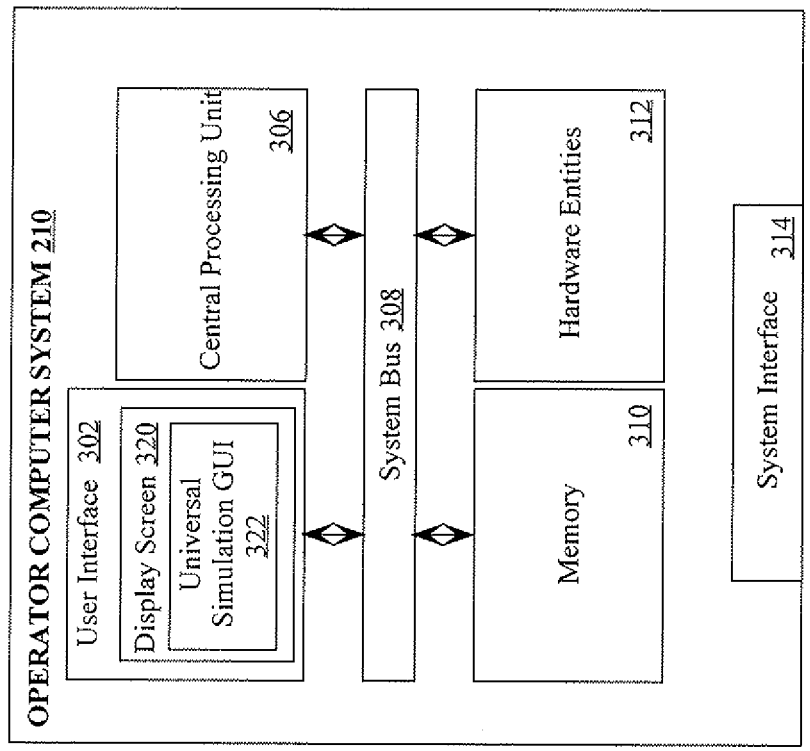
FIG. 3 is a more detailed block diagram of the operator computer system shown in FIGS. 2A-2B according to an embodiment of the invention.

A more detailed block diagram of OCS 210 is provided in FIG. 3. As shown in FIG. 3, OCS 210 is comprised of a system interface 314, a user interface 302, a central processing unit 306, a system bus 308, a memory 310 connected to and accessible by other portions of OCS 210 through the system bus 308, and hardware entities 312 connected to the system bus 308. At least some of the hardware entities 312 perform actions involving access to and use of memory 310, which may be a random access memory (RAM), a disk driver, and/or a compact disc read only memory (CD-ROM).

Hardware entities 312 may include microprocessors, application specific integrated circuits (ASICs), and other hardware. Hardware entities 312 may include a microprocessor programmed for displaying information relating to the simulation of at least one operation of an IPCS (such as the IPCS 100 shown in FIG. 1). Such information can include, but is not limited to, a universal simulation graphical user interface (described below in relation to FIG. 6), computer models, Gantt charts, monitoring data, simulation data, graphs, tables, and trends. Such monitoring data can include, but is not limited to, diagnostic data, network packets, data and status elements, and FOUNDATION FIELDBUS™ specific data structures. Such simulation data can include, but is not limited to, diagnostic data, calibration data, ranges, configuration information, and default settings. In this regard, it should be understood that the microprocessor can access and run a simulation application (described below in relation to FIG. 5) installed on OCS 210. Alternatively, the microprocessor can have the simulation application installed thereon.

User interface 302 is comprised of input devices, output devices, and software routines configured to allow a user to interact with and control software applications installed on OCS 210. Such input and output devices include, but are not limited to, a display screen 320, a speaker (not shown), a keypad (not shown), a directional pad (not shown), a directional knob (not shown), and a microphone (not shown). As such, user interface 302 can facilitate a user-software interaction for displaying information relating to the simulation of at least one operation of an IPCS (such as the IPCS 100 shown in FIG. 1). For example, user interface 302 can facilitate a user-software interaction for displaying a universal simulation graphical user interface (US GUI) 322. US GUI 322 is configured to facilitate user-software interactions for viewing computer models. US GUI 322 is also configured to facilitate user-software interactions for viewing Gantt charts, monitoring data, and/or simulation data generated as a result of running a simulation software program installed on ED/CSs 222, 226.

System interface 314 allows OCS 210 to communicate directly or indirectly with sever 202, database 204, main controller 206, and/or supervisory controller 218. If OCS 210 is communicating indirectly with the devices 202, 204, 206, 218, then OCS 210 is sending and receiving communications through the common communications network 208.

Referring again to FIG. 2A, database 204 can comprise process parameter data used by main controller 206 and/or supervisory controller 218 to control real or simulated automated equipment (not shown). Such process parameter data can include, but is not limited to, data defining temperature parameters, data defining timing parameters, and data defining liquid level parameters. Database 204 can also comprise simulation data records (not shown) and data defining a simulation computer model (e.g., a simulation computer model shown in FIG. 9). The simulation data records (not shown) and simulation computer model will be described below.

Main controller 206 is comprised of hardware and software configured to control and/or manipulate real/simulated automated equipment. As such, main controller 206 is communicatively coupled to the ED/CSs 222, 226 via the FIMs 212, 214 and H1 links 216, 224. As stated above, the phrase "H1 links", as used herein, refers to communications links defining an I/O network (e.g., a FOUNDATION FIELDBUS™ network).

Referring again to FIG. 2A, each of the ED/CSs 222, 226 is comprised of hardware and/or software configured to simulate operations of Fieldbus Field (FF) devices (e.g., FF devices 122, 124 of FIG. 1). In this regard, it should be understood that each of the ED/CSs 222, 226 has a simulation software program installed thereon. The simulation software programs are configured to simulate the operations of the FF devices. The FF devices can include, but are not limited to, motors, pumps, gauges, valves, transmitters, actuators, boilers, distiller units, and sensors. Each of the FF devices can include simulated H1 link buffers (not shown in FIG. 2A) for temporarily storing data before it is sent from an FF device to a FIM 212, 214. Likewise, each of the FIMs 212, 214 can include simulated H1 link buffers (not shown in FIG. 2A) for temporarily storing data before it is sent from a FIM 212, 214 to an FF device. The simulation software program can generate simulation data describing results obtained from simulating the operations of the FF devices. Such simulation data can include, but is not limited to, diagnostic data, calibration data, ranges, configuration information, and default settings.

The simulation software programs use simulation computer models (e.g., the simulation computer model shown in FIG. 9) of the FF device configurations and simulation data records (not shown). Computer models are well known to those having ordinary skill in the art, and therefore will not be described in detail herein. However, it should be understood that the simulation computer model demonstrates a device configuration of an IPCS (such as the IPCS 100 of FIG. 1). More particularly, the simulation computer model illustrates the relationships between the devices of the IPCS (e.g. IPCS 100 of FIG. 1). As such, the simulation computer model comprises functional blocks and interconnections between the functional blocks. Each of the functional blocks represents a particular FF device of an IPCS (e.g., the IPCS 100 shown in FIG. 1). Each of the functional blocks is configured for executing software implementations of FF device operations. An exemplary simulation computer model will be described below in relation to FIG. 9.

The simulation data records (not shown) can comprise data defining the simulation computer model and at least one control strategy employed by components of an IPCS (e.g., the IPCS 100 shown in FIG. 1). The control strategy can be, but is not limited to, a control strategy of the simulation system 200. The phrase "control strategy", as used herein, refers to a combination of events designed to facilitate the performance of an industrial process in accordance with a particular facility and/or government agency plan. An exemplary control strategy will be described below in relation to FIG. 11.

The simulation data records (not shown) can also comprise data defining operating characteristics of the FF devices (e.g., FF devices 122, 124 of FIG. 1), FF device parameters, and communication links between the FF devices and FIMs (e.g., FIMs 114, 116 of FIG. 1 and FIMS 212, 214 of FIG. 2A). Such data can be obtained from the manufactures of the FF devices (e.g., FF devices 122, 124 of FIG. 1). Such data is typically contained in one or more device description files (or DD files). DD files are well known to those having ordinary skill in the art, and therefore will not be described herein. The simulation data records can be stored in database 204. The simulation data records can be loaded to a storage device 228, 229 of the ED/CS 222, 226 subsequent to launching the simulation software program installed on the respective device 222, 226.

Referring again to FIG. 2A, FIMs 212, 214 provide connections between ED/CSs 222, 226 and host system 228. FIMs 212, 214 also provide access to diagnostic information generated by the simulation software program installed on ED/CSs 222, 226. FIMs 212, 214 can generally be configured for delivering systemwide integration of data access, control, connections, diagnostics, and alarms. In this regard, it should be understood that FIMs 212, 214 can calibrate, monitor, and/or control the operations of real and simulated FF devices. FIMs 212, 214 can also provide alerts to flag maintenance notifications, environmental emissions, activation of safety showers, low tank levels, high tank levels, sensor drifts, and the like.

According to an embodiment of the invention, main controller 206 is a C300 Process Controller or C200 Process Controller provided by Honeywell International of Morristown, N.J. FIM 212 is a Chassis Series-A Fieldbus Interface Module or a Series C Fieldbus Interface Module provided by Honeywell International of Morristown, N.J. Similarly, FIM 214 is a Chassis Series-A Fieldbus Interface Module or a Series C Fieldbus Interface Module provided by Honeywell International of Morristown, N.J. The Chassis Series A FIM supports up to two (2) H1 links per module. In contrast, the Series C FIM supports up to four (4) H1 links per module. The invention is not limited in this regard.

Figure 2B:
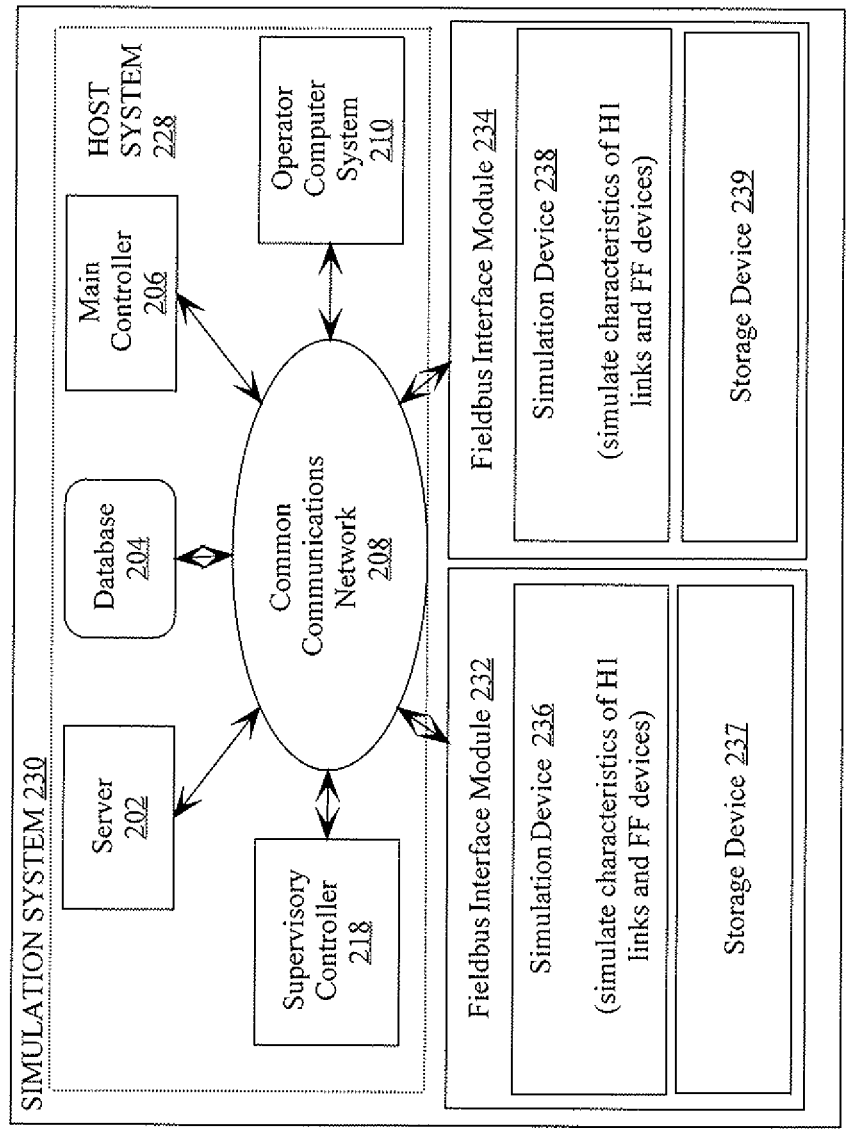
FIG. 2B is a bock diagram of a simulation system according to an embodiment of the invention.

Referring now to FIG. 2B, there is provided another example of a simulation system 230 according to an embodiment of the invention. As shown in FIG. 2B, the simulation system 230 is comprised of a host system 228 and at least one FIM 232, 234. As noted above, the host system 228 is comprised of a server 202, a database 204, a main controller 206, operator computer system (OCS) 210, and a supervisory controller 218. Each of these listed components 202, . . . , 206, 210, 218, 232, 234 is communicatively coupled via a common communications network 208. The common communications network 208 can be an Ethernet Network. Each of these components 202, . . . , 206, 210, 218 is also described above in relation to FIG. 2A. The description provided above is sufficient for understanding the components 202, . . . , 206, 210, 218 of the simulation system 230.

Referring again to FIG. 2B, FIMs 232, 234 are generally configured for delivering systemwide integration of data access, control, connections, diagnostics, and alarms. In this regard, it should be understood that FIMs 232, 234 provide access to diagnostic information generated by the simulation software program installed thereon. FIMs 232, 234 can calibrate, monitor, and/or control the operations of real/simulated FF devices. FIMs 232, 234 can also provide alerts to flag maintenance notifications, environmental emissions, activation of safety showers, low tank levels, high tank levels, sensor drifts, and the like.

According to an embodiment of the invention, main controller 206 is a C200 Process Controller or C300 Process Controller provided by Honeywell International of Morristown, N.J. FIM 232 is a Chassis Series-A Fieldbus Interface Module or a Series C Fieldbus Interface Module provided by Honeywell International of Morristown, N.J. Similarly, FIM 234 is a Chassis Series-A Fieldbus Interface Module or a Series C Fieldbus Interface Module provided by Honeywell International of Morristown, N.J. The Chassis Series A FIM supports up to two (2) H1 links per module. In contrast, the Series C FIM supports up to four (4) H1 links per module. Each of the FIMs is comprised of hardware/software configured to simulate operations and/or control strategies of an IPCS (e.g., IPCS 100 of FIG. 1). The invention is not limited in this regard.

Referring again to FIG. 2B, each of the FIMs 232, 234 is comprised of a simulation device 236, 238, respectively. The simulation devices 236, 238 include hardware and/or software configured to simulate certain operations of an IPCS (such as the IPCS 100 shown in FIG. 1). In this regard, it should be understood that each of the simulation devices 236, 238 has a simulation software program installed thereon. The simulation software programs are configured to simulate the characteristics of H1 links (e.g., H1 links $126_1$, $126_2$ of FIG. 1), FF devices (e.g., FF devices 122, 124 of FIG. 1), and at least one characteristic of a FIM 232, 234. As noted above, the H1 links are communications links defining an I/O network (e.g., a FOUNDATION FIELDBUS™ network). The FF devices can include, but are not limited to, motors, pumps, gauges, valves, transmitters, actuators, boilers, distiller units, and sensors. The simulation software program can generate simulation data describing results obtained from simulating the operations of the FF devices. Such simulation data can include, but is not limited to, diagnostic data, calibration data, ranges, configuration information, and default settings.

The simulation software programs use simulation computer models and simulation data records (not shown). The simulation computer models will be described below in relation to FIG. 9. However, it should be understood that the simulation computer models demonstrate device configurations of an IPCS (e.g., the IPCS 100 of FIG. 1). More particularly, the simulation computer models illustrate the relationships between particular devices of the IPCS (e.g. IPCS 100 of FIG. 1). As such, the simulation computer models comprise functional blocks and interconnections between the functional blocks. Each of the functional blocks represents an FF device of an IPCS (e.g., the IPCS 100 shown in FIG. 1). The interconnections represent the H1 links (e.g., H1 links $126_1$, $126_2$ of FIG. 1) between FF devices (e.g., FF devices 122, 124 of FIG. 1) and at least one FIM (e.g., FIMs 114, 116 of FIG. 1 and FIMs 232, 234 of FIG. 2B).

The simulation data records (not shown) can be stored in database 204. The simulation data records can be loaded to a storage device 237, 239 of the FIM 232, 234 subsequent to launching the simulation software program installed on the FIM 232, 234. The simulation data records (not shown) can comprise data defining the simulation computer model and at least one control strategy employed by components of an IPCS (e.g., the IPCS 100 shown in FIG. 1). An exemplary control strategy will be described below in relation to FIG. 11. The simulation data records (not shown) can also comprise data defining operating characteristics of the FF devices (e.g., FF devices 122, 124 of FIG. 1). Such data can generally be obtained from the manufactures of the FF devices. Such data is typically contained in one or more device description files (or DD files). DD files are well known to those having ordinary skill in the art, and therefore will not be described herein. The simulation data records can further comprise data defining the characteristics of H1 links (e.g., H1 links $126_1$, $126_2$ of FIG. 1) between FF devices (e.g., FF devices 122, 124 of FIG. 1) and FIMs (e.g., FIMs 114, 116 of FIG. 1 and FIMs 232, 234 of FIG. 2B).

Figure 2C:
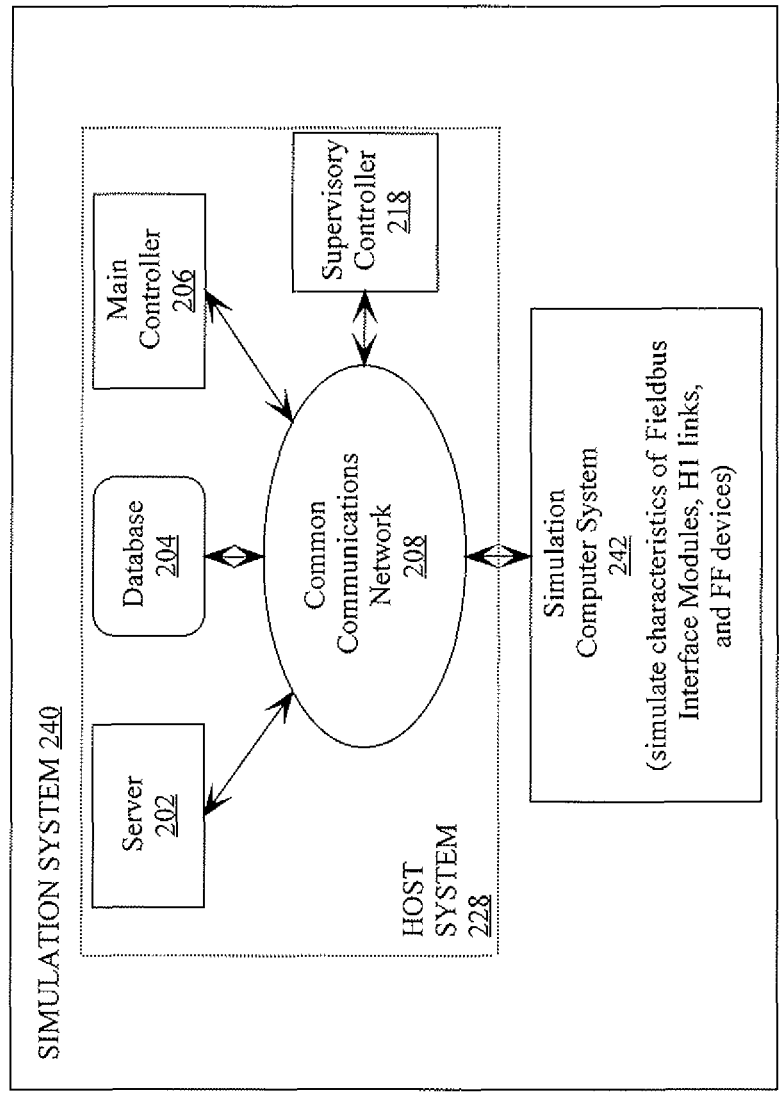
FIG. 2C is a bock diagram of a simulation system according to another embodiment of the invention.

Referring now to FIG. 2C, there is provided yet another example of a simulation system 240 according to an embodiment of the invention. As shown in FIG. 2C, simulation system 240 is comprised of a host system 228 and a simulation computer system (SCS) 242. As noted above, the host system 228 comprises a server 202, a database 204, a main controller 206, and a supervisory controller 218. Each of the listed components 202, . . . , 206, 218, 242 are communicatively coupled via a common communications network 208. The common communications network 208 can be an Ethernet Network. Each of these components 202, . . . , 206, 218 is described above in relation to FIG. 2A. The description provided above is sufficient for understanding the components 202, . . . , 206, 218 of simulation system 240.

SCS 242 is configured to facilitate control strategy configuration, operator training, and Factory Acceptance Testing (FAT) of automated equipment. SCS 242 is typically a desktop personal computer system, a laptop personal computer system, a personal digital assistant, a wireless computing device, or any other general purpose computer processing device.

Figure 4:
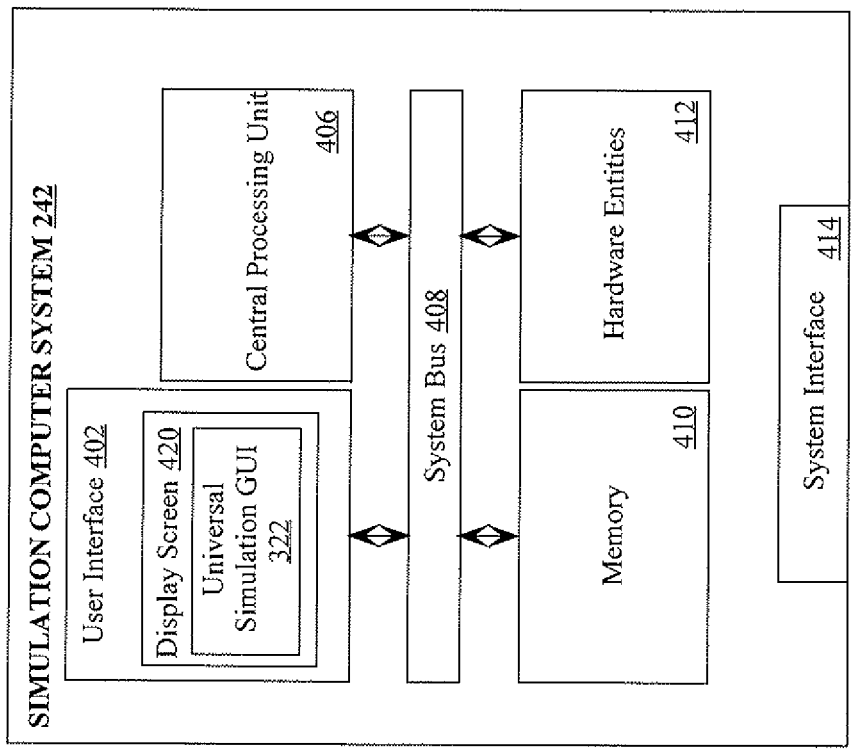
FIG. 4 is a more detailed block diagram of the simulation computer system shown in FIG. 2C according to an embodiment of the invention.

A more detailed block diagram of SCS 242 is provided in FIG. 4. As shown in FIG. 4, SCS 242 is comprised of a system interface 414, a user interface 402, a central processing unit 406, a system bus 408, a memory 410 connected to and accessible by other portions of SCS 242 through system bus 408, and hardware entities 412 connected to system bus 408. At least some of the hardware entities 412 perform actions involving access to and use of memory 410, which may be a random access memory (RAM), a disk driver, and/or a compact disc read only memory (CD-ROM).

Hardware entities 412 may include microprocessors, application specific integrated circuits (ASICs), and other hardware. Hardware entities 412 may include a microprocessor programmed for simulating at least one operation of an IPCS (such as the IPCS 100 shown in FIG. 1). In this regard, it should be understood that the microprocessor can access and run a simulation software program installed on SCS 242. Alternatively, the microprocessor can have the simulation software program installed thereon.

The simulation software program can be configured to simulate the characteristics of at least one FIM (e.g., FIMs 114, 116 of FIG. 1), at least one H1 link (e.g., H1 Links $126_1$, $126_2$ of FIG. 1), and/or at least one FF device (e.g., FF devices 122, 124 of FIG. 1). The simulation software program can use simulation computer models and simulation data records (not shown). Simulation computer models will be described below in relation to FIG. 9. However, it should be understood that the simulation computer models demonstrate device configurations of an IPCS (e.g., the IPCS 100 of FIG. 1). More particularly, the simulation computer models illustrate the relationships between the devices of the IPCS (e.g. IPCS 100 of FIG. 1). As such, the computer models comprise functional blocks and interconnections between the functional blocks. Each of the functional blocks represents a FIM (e.g., FIMs 114, 116 of FIG. 1) or an FF device (e.g., FF devices 122, 124 of FIG. 1). The interconnections define the H1 links (e.g., H1 Links $126_1$, $126_2$ of FIG. 1) between the FIMs and FF devices. The microprocessor can generate simulation data describing results obtained from simulating the operations of FIMs and FF devices. Such simulation data can include, but is not limited to, diagnostic data, calibration data, ranges, configuration information, and default settings.

The simulation data records (not shown) can be stored in database 204 (shown in FIG. 2C). The simulation data records can be loaded to memory 410 subsequent to launching the simulation software program installed on SCS 242. As such, the microprocessor can access the database 204 and retrieve simulation data records (not shown) therefrom. Similarly, the microprocessor can access memory 410 and retrieve simulation data records (not shown) therefrom.

The simulation data records (not shown) can comprise data defining the simulation computer model and at least one control strategy employed by components of an IPCS (e.g., the IPCS 100 shown in FIG. 1). An exemplary control strategy will be described below in relation to FIG. 11. The simulation data records (not shown) can also comprise data defining operating characteristics and device parameters of FIMs (e.g., FIMs 114, 116 of FIG. 1) and/or FF devices (e.g., FF devices 122, 124 of FIG. 1). Such data can be obtained from the manufactures of the FIMs and/or FF devices. Such data is typically contained in one or more device description files (or DD files). DD files are well known to those having ordinary skill in the art, and therefore will not be described herein. The simulation data records can further comprise data defining the characteristics of (a) H1 links (e.g., H1 Links $126_1$, $126_2$ of FIG. 1) between FF devices (e.g., FF devices 122, 124 of FIG. 1) and FIMs (e.g., FIMS 114, 116 of FIG. 1), and (b) communications links between the FIMs and components 202, 204, 206, 218 of a host system 228 (shown in FIG. 2C).

Hardware entities 412 may further include a microprocessor programmed for displaying information relating to the simulation of at least one operation of an IPCS (such as the IPCS 100 shown in FIG. 1). Such information can include, but is not limited to, a universal simulation graphical user interface (described below in relation to FIG. 6), computer models, Gantt charts, monitoring data, simulation data, graphs, tables, and trends. Such monitoring data can include, but is not limited to, diagnostic data, network packets, data and status elements, and FOUNDATION FIELDBUS™ specific data structures. Such simulation data can include, but is not limited to, diagnostic data, calibration data, ranges, configuration information, and default settings. In this regard, it should be understood that the microprocessor can access and run a simulation application (described below in relation to FIG. 5) installed on SCS 242. Alternatively, the microprocessor can have the simulation application installed thereon. As should be understood, the simulation application can be a portion of the simulation software program or software separate from the simulation software program.

User interface 402 is comprised of input devices, output devices, and software routines configured to allow a user to interact with and control software applications installed on SCS 242. Such input and output devices include, but are not limited to, a display screen 420, a speaker (not shown), a keypad (not shown), a directional pad (not shown), a directional knob (not shown), and a microphone (not shown). As such, user interface 402 can facilitate a user-software interaction for simulating at least one operation of an IPCS (such as the IPCS 100 shown in FIG. 1).

User interface 402 can also facilitate a user-software interaction for displaying information relating to the simulation of at least one operation of an IPCS (such as the IPCS 100 shown in FIG. 1). For example, user interface 402 can facilitate a user-software interaction for displaying a universal simulation graphical user interface (US GUI) 322. US GUI 322 is configured to facilitate user-software interactions for viewing computer models. US GUI 322 is also configured to facilitate user-software interactions for viewing Gantt charts, monitoring data, and/or simulation data generated as a result of running a simulation software program installed on SCS 242.

System interface 414 allows SCS 242 to communicate directly or indirectly with sever 202 (described above in relation to FIG. 2C), database 204 (described above in relation to FIG. 2C), main controller 206 (described above in relation to FIG. 2C), and/or supervisory controller 218 (described above in relation to FIG. 2C). If SCS 242 is communicating indirectly with the devices 202, 204, 206, 218, then SCS 242 is sending and receiving communications through the common communications network 208.

Figure 5:
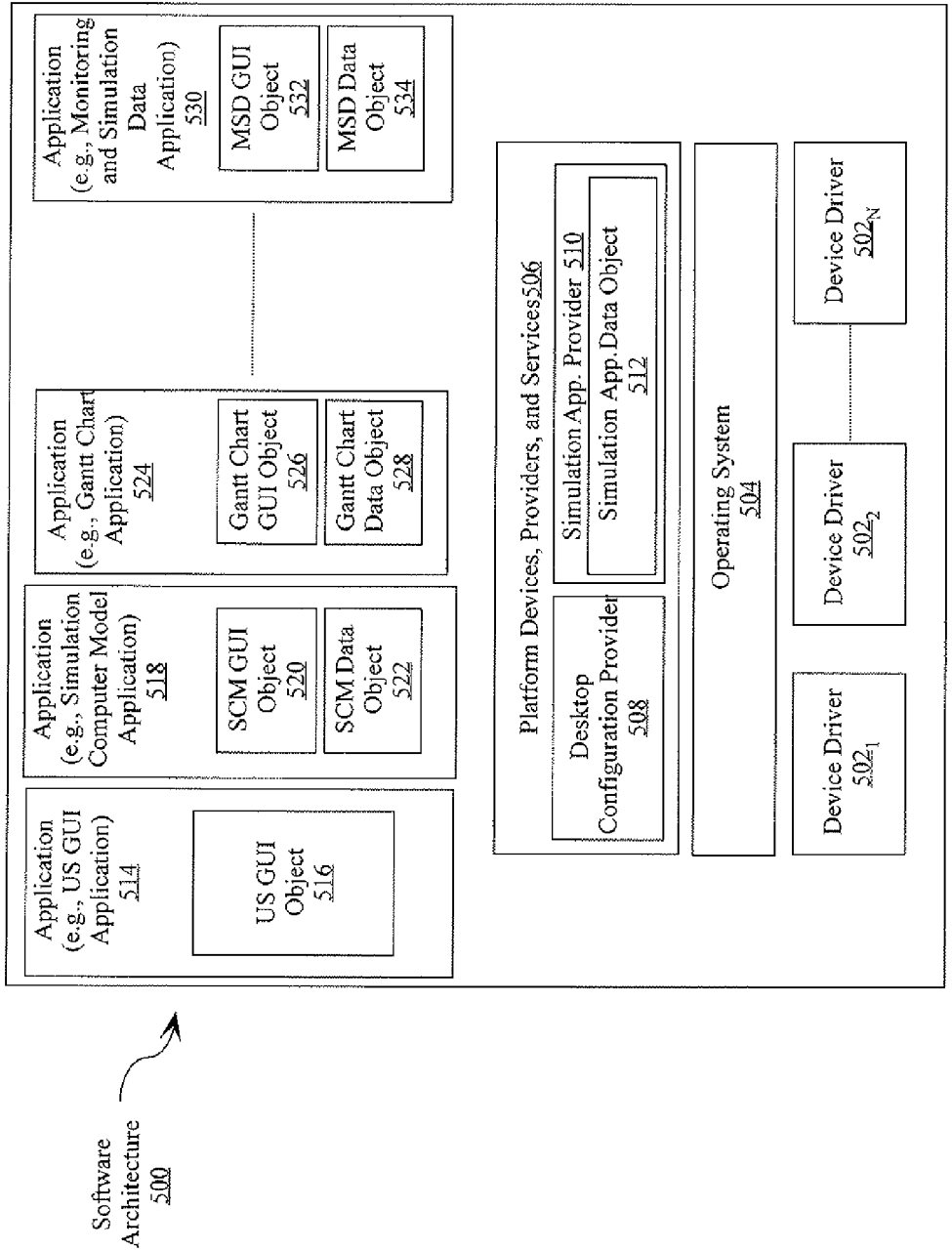
FIG. 5 is a block diagram of an exemplary software architecture for the operator computer system of FIG. 3 and/or the simulation computer system of FIG. 4 according to an embodiment of the invention.

Referring now to FIG. 5, there is provided an exemplary software architecture 500 for OCS 210 (described above in relation to FIGS. 2A-2B) and/or SCS 242 (described above in relation to FIG. 2C). However, it should be understood that SCS 242 can further include a simulation software program (not shown in FIG. 5). Accordingly, the present invention is not limited to the exemplary software architecture 500 shown in FIG. 5.

Referring again to FIG. 5, software architecture 500 can include levels of software programs. As shown in FIG. 5, the software architecture 500 includes device driver software programs $502_1$, $502_2$, ..., $502_N$, an operating system (OS) 504, platform device/provider/service (PDPS) software programs 506, and software applications 514, 518, 524, 530. The software programs $502_1$, $502_2$, ..., $502_N$, 504 of software architecture 500 are well known to persons having ordinary skill in the art. Thus, the software programs $502_1$, $502_2$, ..., $502_N$, 504 will not be described in detail herein. However, a brief description of the software architecture 500 is provided to assist a reader in understanding the present invention.

A device driver software program $502_1$, $502_2$, ..., $502_N$ typically is software the OCS 210 and/or SCS 242 uses to facilitate communications between hardware components (e.g., hardware components 302, 306, 310, 312 described above in relation to FIG. 3 and hardware components 402, 406, 410, 412 described above in relation to FIG. 4). A device driver software program $502_1$, $502_2$, ..., $502_N$ can include code for managing access to hardware components, setting hardware component parameters, and transmitting data between hardware components.

OS 504 is system software responsible for the direct control and management of the OCS 210 or SCS 242 hardware (e.g., hardware components 302, 306, 310, 312 described above in relation to FIG. 3 and hardware components 402, 406, 410, 412 described above in relation to FIG. 4). Typically, OS 504 manages basic computer system 210, 242 operations, such as loading and running software applications. OS 504 is also system software responsible for enabling a user to control hardware coupled to the computer system 210, 242. OS 504 can also include instructions to install, launch, and manage applications. OS 504 is typically stored in memory 310, 410 (described above in relation to FIGS. 3-4) which may be a ROM, hard drive, or other storage device.

The PDPS software programs 506 include a desktop configuration provider (DCP) 508 and a simulation application provider (SAP) 510. The invention is not limited in this regard. For example, the PDPS software programs 506 can further include a communications provider and other providers/services known in the art. DCP 508 is software responsible for the direct control and management of desktop configurations. Desktop configurations are well known to those having ordinary skill in the art, and therefore will not be described herein.

SAP 510 is software responsible for providing simulation application functionalities to the applications 514, 518, 524, 530. SAP 510 is comprised of a simulation application (SA) data object 512. SA data object 512 is software including instructions for receiving messages from the GUI objects 516, 520, 526, 532 and processing the data contained in the messages. The SA data object 512 also comprises instructions for updating monitoring/simulation information and communicating updated monitoring/simulation information to the GUI objects 516, 520, 526, 532 and/or applications 514, 518, 524, 530. In this regard, it should be understood that the SA data object 512 can comprise instructions for obtaining monitoring/simulation information from database 204 (described above in relation to FIGS. 2A-2C), ED/CSs 222, 226 (described above in relation to FIG. 2A), and/or FIMs 232, 234 (described above in relation to FIG. 2B). SA data object 512 can also comprise instructions for communicating monitoring/simulation information to the GUI objects 516, 520, 526, 532.

Software applications 514, 518, 524, 530 typically include programs designed for end users. Software applications 514, 518, 524, 530 are typically installed on the computer system 210, 242. As shown in FIG. 5, software applications 514, 518, 524, 530 can comprise a US GUI application 514, a simulation computer model application 518, a Gantt chart application 524, and a monitoring and simulation data (MSD) application 530.

US GUI application 514 can include a US GUI object 516. US GUI object 516 is software combining code objects with GUI elements to create a US GUI 322 (described above in relation to FIGS. 3-4 and described below in relation to FIG. 6). Applications 518, 524, 530 can be accessed, run, and used from within the US GUI 322.

Each of the applications 518, 524, 530 includes a GUI object 520, 526, 532 and a data object 522, 528, 534. Notably, each GUI object 520, 526, 532 and data object 522, 528, 534 is created during the initialization of a respective application 518, 524, 530. Each of the GUI objects 520, 526, 532 is bounded to a respective data object 522, 528, 534. The term "bound", as used herein, means that objects are configured for communicating with each other. The term "initialize", as used herein, refers to a process of preparing an application for use by calling certain functions. The initialization of the applications 518, 524, 530 is typically performed when application 514 is run. Each object 516, 520, 526, 532, 522, 528, 534 can be created when a user requests a respective application 514, 518, 524, 530.

Each of the GUI objects 516, 520, 526, 532 is software combining code objects with GUI elements to create a GUI user interface (e.g., the GUI user interfaces 322, 660, . . . , 670 described below in relation to FIG. 6). Each of the GUI objects 520, 526, 532 can include instructions for communicating messages to a respective data object 522, 528, 534. The messages can include information indicating that certain events have occurred (e.g., a user has clicked a certain button of a toolbar). Each of the GUI objects 520, 526, 532 can also include instructions for receiving messages from the respective data objects 522, 528, 534, and changing (updating or refreshing) information of a displayed GUI in response to the message(s).

Each of the data objects 522, 528, 534 is software comprising instructions for receiving messages from the GUI objects 520, 526, 532 and processing the data contained in the messages. Each of the data objects 522, 528, 534 also comprises instructions for updating monitoring/simulation information and communicating updated monitoring/simulation information to the GUI objects 520, 526, 532. Each of the data objects 522, 528, 534 can comprise instructions for obtaining monitoring/simulation information from database 204 (described above in relation to FIGS. 2A-2C), ED/CSs 222, 226 (described above in relation to FIG. 2A), and/or FIMs 232, 234 (described above in relation to FIG. 2B). Each of the data objects 522, 528, 534 can also comprise instructions for communicating monitoring/simulation information to the GUI objects 520, 526, 532.

It should be noted that each of the data objects 512, 522, 528, 534 can be changed via code written by a user (e.g., a customer, an engineer, a technician, or a supervisor) using an application running outside of or from within the desktop application (e.g., UPS software) or other service provided by the desktop application. As such, the user can construct a customized user interface (e.g., a customized user interface configured to replace a standard simulation control user interface described below in relation to FIG. 6).

Figure 6:
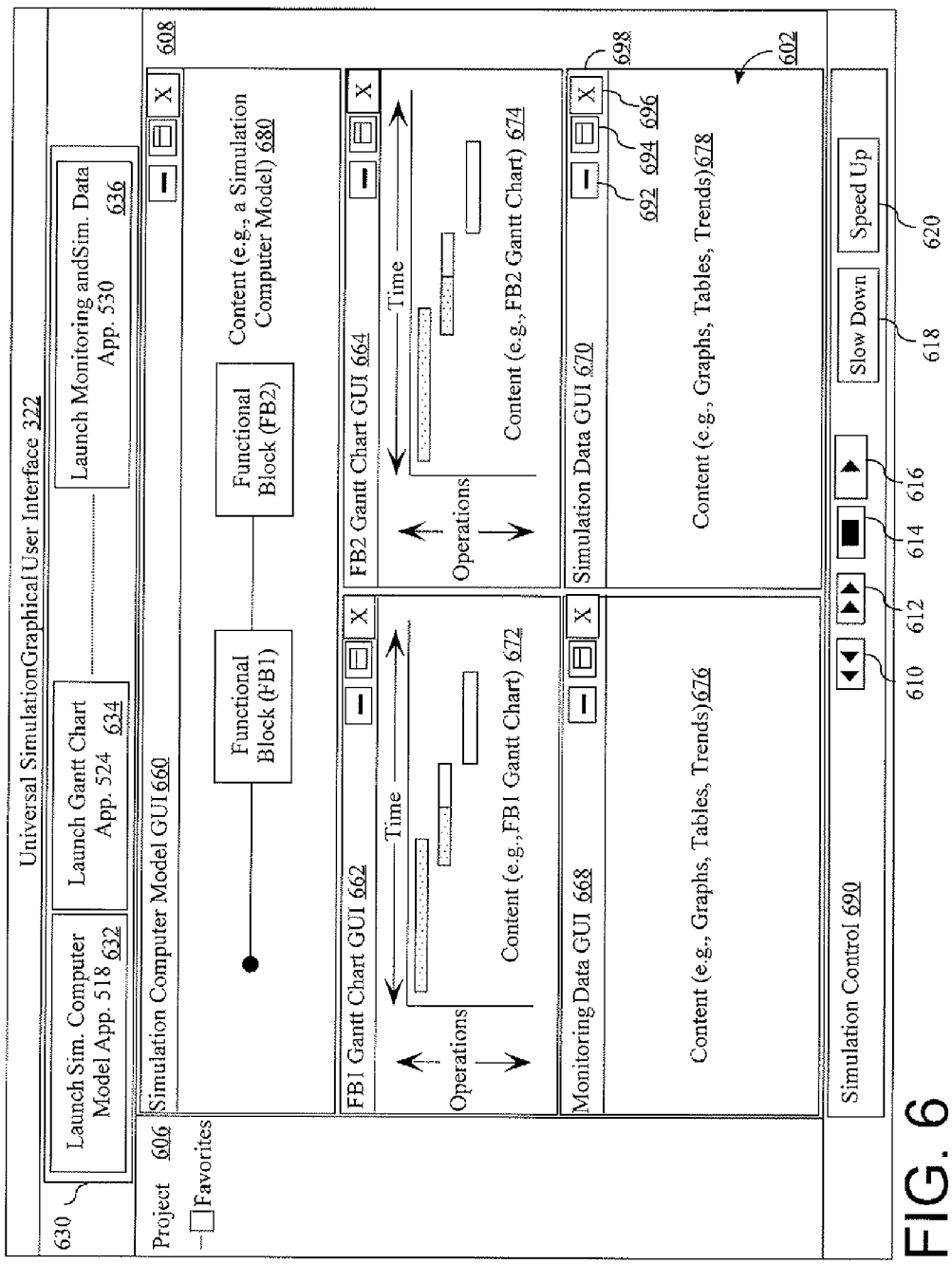
FIG. 6 is a schematic illustration of a universal simulation graphical user interface according to an embodiment of the invention.

Referring now to FIG. 6, there is provided a schematic illustration of the US GUI 322 according to an embodiment of the invention. US GUI 322 is generally configured for displaying Fieldbus simulation status and progress. US GUI 322 is also generally configured for displaying simulation computer models, Gantt charts for each Fieldbus device being simulated, monitoring data, and/or simulation data. US GUI 322 is further generally configured for facilitating user-software interactions to speed-up/slow-down a simulation time of a simulated operation included in a Link Active Schedule (described below in relation to FIGS. 13A-13C), to step backwards by at least one simulated operation included in the Link Active Schedule, to step forwards by at least one simulated operation included in the Link Active Schedule, to stop a functional block execution process (described below in relation to FIG. 14) performed by the simulation program using the Link Active Schedule, and/or to re-start the functional block execution process performed by the simulation program using the Link Active Schedule.

As shown in FIG. 6, US GUI 322 is comprised of a workspace portion 606, a content/GUI display area 608, a tool or ribbon bar 630, and a simulation control 690. The workspace portion 606 is configured to facilitate user-software interactions for adding content to a favorites file, removing contents from the favorites file, and/or quickly accessing content of the favorites file for purposes of starting the same. The workspace portion 606 can also be configured to facilitate user-software interactions for quickly accessing applications 518, 524, 530 for purposes of launching the same. The term "launch", as used herein, means to start a software program or application.

The content/GUI display area 608 is provided for displaying content (e.g., simulation computer models, Gantt charts, graphs, tables, and trends) 672, . . . , 680 and/or graphical user interfaces (GUIs) 660, . . . , 664, 668, 670 to a user (e.g., an operator, a technician, an engineer, or a supervisor). GUIs 660, . . . , 664, 668, 670 are provided for facilitating user-software interactions for performing application specific operations. For example, each GUI 660, ..., 664, 668, 670 can include a tool bar or status strip 698 comprising a plurality of widgets 692, 994, 696 for minimizing a display screen window, maximizing a display screen window, and/or closing a display screen window. The invention is not limited in this regard. For example, each GUI 660, ..., 664, 668, 670 can additionally or alternatively include widgets (not shown) for facilitating user-software interactions for updating displayed data, refreshing displayed data, viewing historical data (e.g., data that was collected during a fully performed run of a manufacturing process or during a fully performed run of a simulation process), and/or activating a hairline. Hairlines are well known to those having ordinary skill in the art, and therefore will not be described herein.

Each GUI 660, ..., 664, 668, 670 can include an area 602 for displaying application specific content 672, ..., 680 to a user (e.g., an operator, a technician, an engineer, or a supervisor). For example, GUI 660 is a simulation computer model GUI configured to display content 680 including simulation computer models (described below in relation to FIG. 9). GUIs 662, 664 are Gantt chart GUIs configured to display respective content 672, 674 including Gantt charts. GUIs 668, 670 are data GUIs configured to display respective content 676, 678 including graphs, tables, tends, and the like. The invention is not limited in this regard.

It should be noted that the present invention is not limited to the GUI inter-positional arrangement shown in FIG. 6. The GUIs 660, ..., 664, 668, 670 can have any GUI inter-positional arrangement selected in accordance with a particular simulation application. It should also be noted that each of the GUIs 660, ..., 664, 668, 670 can be moved by clicking on a respective tool bar or status strip 698 and dragging it to a location of interest within the content/GUI display area 608.

The tool or ribbon bar 630 is provided for facilitating user-software interactions for launching applications. For example, the tool or ribbon bar 630 can be comprised of a plurality of buttons 632, 634, 636 for facilitating user-software interactions for launching applications 518, 524, 530 (described above in relation to FIG. 5), respectively. The invention is not limited in this regard. The tool or ribbon bar 630 can comprise any type and/or number of widgets selected in accordance with a particular simulation application.

It should be noted that the tool or ribbon bar 630 shown in FIG. 6 is an exemplary embodiment of a tool or ribbon bar. Embodiments of the invention are not limited to the configuration shown in FIG. 6. For example, if none of the applications 518, 524, 530 (described above in relation to FIG. 5) are launched, then a set of buttons for creating an instance of a graphic and/or trend can appear at a top-left of the US GUI 322 and/or below the tool or ribbon bar 630. If an application 518, 524, 530 (described above in relation to FIG. 5) is launched, then the tool or ribbon bar 630 can change to expose controls related to the application 518, 524, 530. As should be understood, the tool or ribbon bar 630 can be changed each time an application 518, 524, 530 is launched. Also, the controls for the applications 518, 524, 530 can be application specific.

Referring again to FIG. 6, the simulation control 690 can include a tool bar or status strip comprising a plurality of widgets. The invention is not limited in this regard. For example, the simulation control 690 can be provided in a separate window as opposed to an object of the US GUI 322. The simulation control 690 facilitates user-software interactions for performing operations to control and/or manipulate a simulation process. For example, simulation control 690 includes a plurality of buttons 610, ..., 620. Button 610 is configured to facilitate a user-software interaction for stepping backwards by at least one simulated operation included in the Link Active Schedule (described below in relation to FIGS. 13A-13C). Button 612 is configured to facilitate a user-software interaction for stepping forwards by at least one simulated operation included in the Link Active Schedule. Button 614 is configured to facilitate a user-software interaction for stopping simulation process or a functional block execution process (described below in relation to FIG. 14) performed by the simulation program using the Link Active Schedule. Button 616 is configured to facilitate a user-software interaction for re-starting the simulation program or functional block execution process. Button 618 is configured to facilitate a user-software interaction for slowing down a simulation time of simulated operations included in the Link Active Schedule. Button 620 is configured to facilitate a user-software interaction for speeding up a simulation time of simulated operations included in the Link Active Schedule. The invention is not limited in this regard. The simulation control 690 can include any type or number of widgets selected in accordance with a particular simulation application.

Figure 7A:
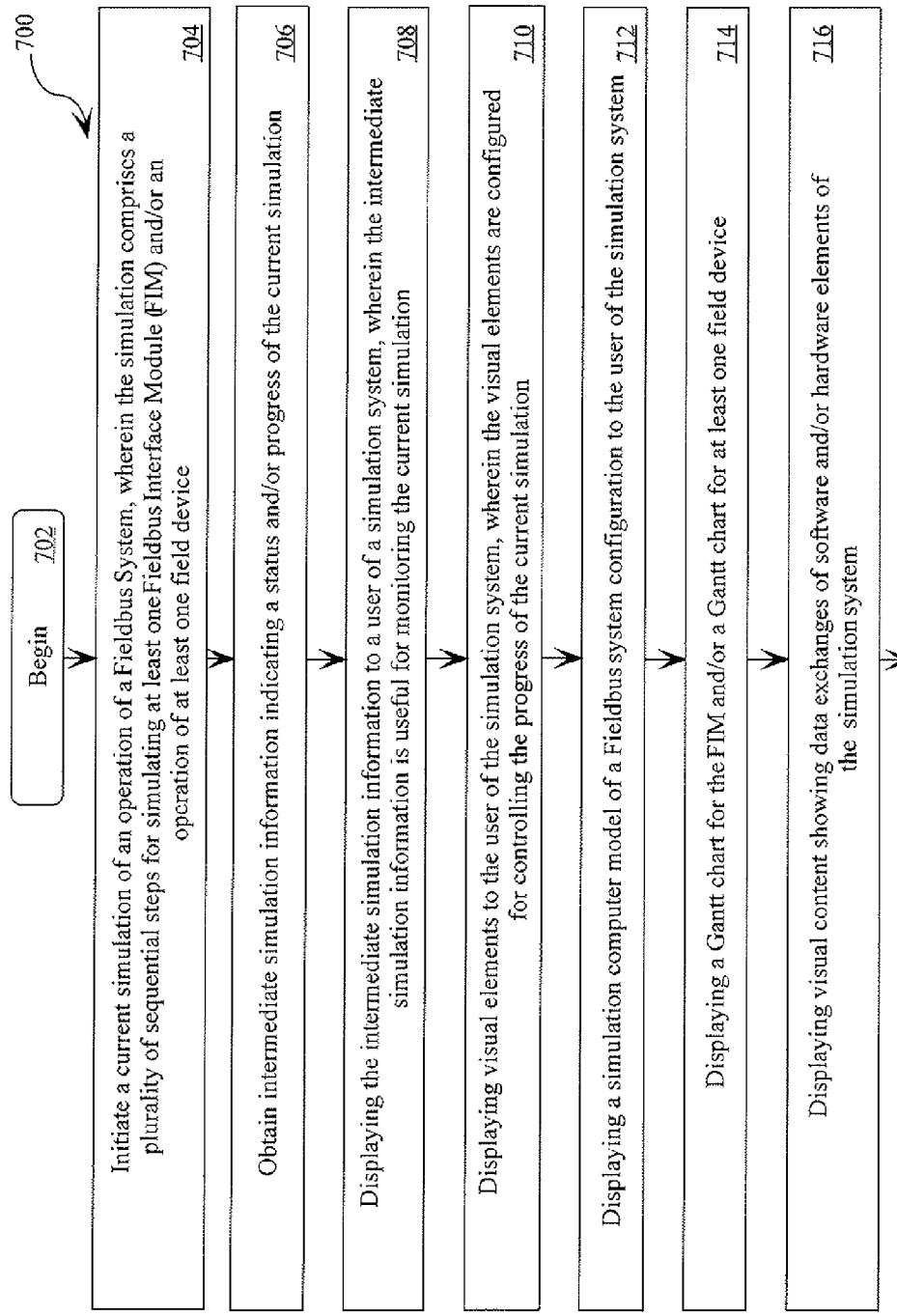

Method for Monitoring and Controlling a Simulation of an Operation of a Fieldbus System Referring now to FIGS. 7A-7B, there is provided a flow diagram of a method 700 for monitoring and controlling a simulation of an operation of a Fieldbus system according to an embodiment of the invention. As shown in FIG. 7A, method 700 begins with step 702 and continues to step 704. In step 704, a current simulation of an operation of Fieldbus system is initiated. The current simulation comprises a plurality of sequential steps for simulating an operation of at least one FIM of a Fieldbus system and/or an operation of at least one field device of the Fieldbus system. Thereafter, step 706 is performed where intermediate simulation information is obtained. The intermediate simulation information includes information useful for monitoring the current simulation. In particularly, the intermediate simulation information includes information indicating a status and/or a progress of the current simulation. For example, the intermediate simulation information comprises progress information defining which steps of the sequential steps have been performed, are being performed, and to be performed.

After completing step 706, method 700 continues with step 708. In step 708, at least a portion of the intermediate simulation information is communicated to at least one user (e.g., a customer, an engineer, a technician, or a supervisor) of a simulation system (e.g., the simulation system 200 of FIG. 2A, the simulation system 230 of FIG. 2B, or the simulation system 240 of FIG. 2C). For example, the intermediate simulation information is communicated to a user via a computer display, a speaker, a light, or other auditory/visual indicating device. The invention is not limited in this regard.

In step 710, visual elements (e.g., buttons 610, ..., 620 of FIG. 6) are displayed to the user of the simulation system. The visual elements are configured for controlling the progress of the current simulation. For example, the visual elements can be GUI buttons configured for facilitating user-software interactions for controlling the progress of the current simulation. The invention is not limited in this regard. The visual elements can be any type of visual element selected in accordance with a particular simulation application.

Upon completing step 710, method 700 continues with step 712. In step 712, a simulation computer model is displayed to the user of the simulation system. An exemplary simulation computer model will be described below in relation to FIG. 9.

However, it should be understood that the simulation computer model comprises functional blocks and interconnections between the functional blocks. The functional blocks represent at least one FIM and/or at least one field device. Gantt charts for the FIM and/or field device can also be displayed to the user in step 714. Visual content showing data exchanges can be displayed to the user in step 716. The data exchanges can be between software elements and/or hardware elements of the simulation system. Subsequent to completing step 716, method 700 continues with steps 718-728 of FIG. 7B.

In step 718, the user uses a first one of the visual elements (e.g., button 620 of FIG. 6) to speed up the current simulation. In step 720, the user uses a second one of the visual elements (e.g., button 618 of FIG. 6) to slow down the current simulation. In step 722, the user uses a third one of the visual elements (e.g., button 610 of FIG. 6) to move the progress of the current simulation backwards. In step 724, the user uses a fourth one of the visual elements (e.g., button 612 of FIG. 6) to move the progress of the current simulation forwards. In step 726, the user uses a fifth one of the visual elements (e.g., button 614 of FIG. 6) to stop the current simulation. In step 728, the user uses a sixth one of the visual elements (e.g., button 616 of FIG. 6) to re-start the current simulation. After completing step 728, step 730 is performed where method 700 ends.

Method for Simulating an Operation of a Fieldbus System

Figure 8A:
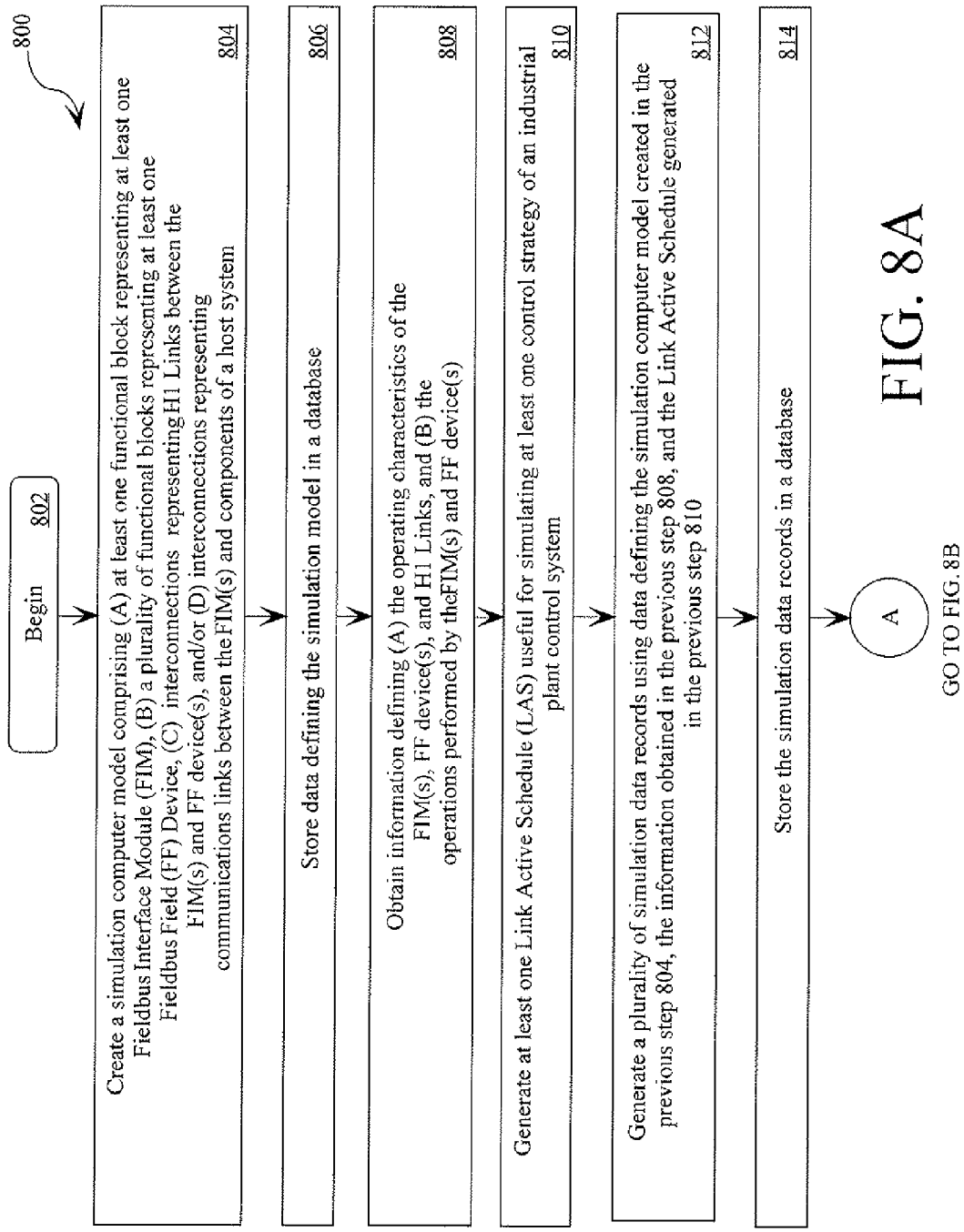

The following FIGS. 8A-8B and accompanying text illustrate a method 800 according to an embodiment of the invention for simulating an operation of a Fieldbus system comprising at least one Fieldbus Interface Module (FIM) communicatively coupled to a plurality of Fieldbus Field (FF) devices. It should be appreciated, however, that the method 800 disclosed herein is provided for purposes of illustration only and that the present invention is not limited solely to the method shown.

Referring now to FIG. 8A, method 800 begins at step 802 and continues with step 804. In step 804, a simulation computer model is created. The simulation computer model can comprise functional blocks representing at least one FIM and/or at least one FF device. The simulation computer model can also comprise interconnections defining H1 links between FIM(s) and FF devices, and/or interconnections defining communications links between FIM(s) and components of a host system (e.g., the host system 228 of FIGS. 2A-2C). A schematic illustration of an exemplary simulation computer model 900 is provided in FIG. 9.

Figure 9:
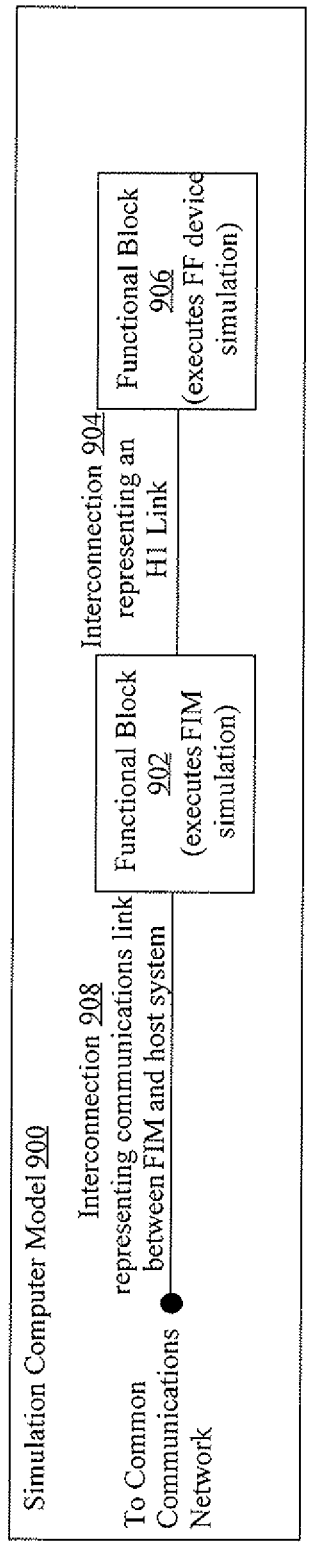
FIG. 9 is a block diagram of an exemplary simulation computer model according to an embodiment of the invention.

As shown in FIG. 9, the simulation computer model 900 can comprise a functional block 902 configured for executing a FIM simulation, a functional block 906 configured for executing an FF device simulation, an interconnection 908 representing a communications link between a FIM and a host system, and an interconnection 904 representing an H1 link between an FF device and a FIM. The invention is not limited in this regard. The simulation computer model can include any number of functional blocks and interconnections selected in accordance with a particular simulation application.

Referring again to FIG. 8A, method 800 continues with step 806. In step 806, data defining the simulation computer model is stored in a database (e.g., database 204 of FIGS. 2A-2C). In step 808, information is obtained that defines the operating characteristics of the at least one FIM, at least one FF device, and at least one H1 link. Step 808 also involves obtaining information defining operations performed by the least one FIM and at least one FF device. A table 1000 illustrating exemplary operations defining information (ODI) is provided in FIG. 10.

As shown in FIG. 10, the ODI includes operation identifiers 1002 and operation descriptions 1004. The operation identifiers 1002 can include identifiers for operations performed by at least one FF device and identifiers for operations performed by at least one FIM. The invention is not limited in this regard. The ODI can include information for operations performed by any device of an IPCS (e.g., IPCS 100 of FIG. 1) selected in accordance with a particular simulation system 200, 230, 240 application.

The operation descriptions 1004 can describe the operations of an FF device or a FIM associated with the operation identifiers 1002. For example, an AI Operation involves generating an analog input signal representing a sensed/measured value and communicating the analog input signal from a sensor/gauge of an FF device to a processor of the FF device. An AIA_3 Operation involves processing an analog input signal to place a sensed/measured value in an H1 link format suitable for communications from an FF device to a FIM over an H1 link. An AI.Out Operation involves writing sensed/measured value in an H1 link format to a simulated H1 link buffer of an FF device. An AI_Agent Operation involves reading a sensed/measured value from a simulated H1 buffer of an FF device, processing the sensed/measured value to place the same in a CCN format suitable for communications over a common communications network, and writing the sensed/measured value in the CCN format to a CCN buffer of a FIM. A PID_Agent Operation involves reading control data from a CCN Buffer of a main controller, processing the control data to place the same in an H1 link format suitable for communications over an H1 link, and writing the control data in the H1 link format to a simulated H1 buffer of a FIM. An AO Operation involves reading control data from a simulated H1 buffer of a FIM, processing the control data, and performing a particular event specified by the control data. An AO.BKOUT Operation involves generating return data indicating that the particular event has occurred, processing the return data to place the same in an H1 link format suitable for communications over an H1 link, and writing the return data to a simulated H1 link Buffer of an FF device. The invention is not limited in this regard. The operation descriptions 904 can describe the operations of any device of an IPCS (e.g., the IPCS 100 of FIG. 1) selected in accordance with a particular simulation system 200, 230, 240 application.

Referring again to FIG. 8A, method 800 continues with step 810. In step 810, a Link Active Schedule is generated. The Link Active Schedule is used by simulation software for simulating at least one control strategy of an IPCS (such as the IPCS 100 of FIG. 1). After being generated, the Link Active Schedule can be stored in a database (e.g., database 204 described above in relation to FIGS. 2A-2C). A schematic illustration of an exemplary process 1100 for generating a Link Active Schedule 1106 is provided in FIG. 11.

Figure 11:
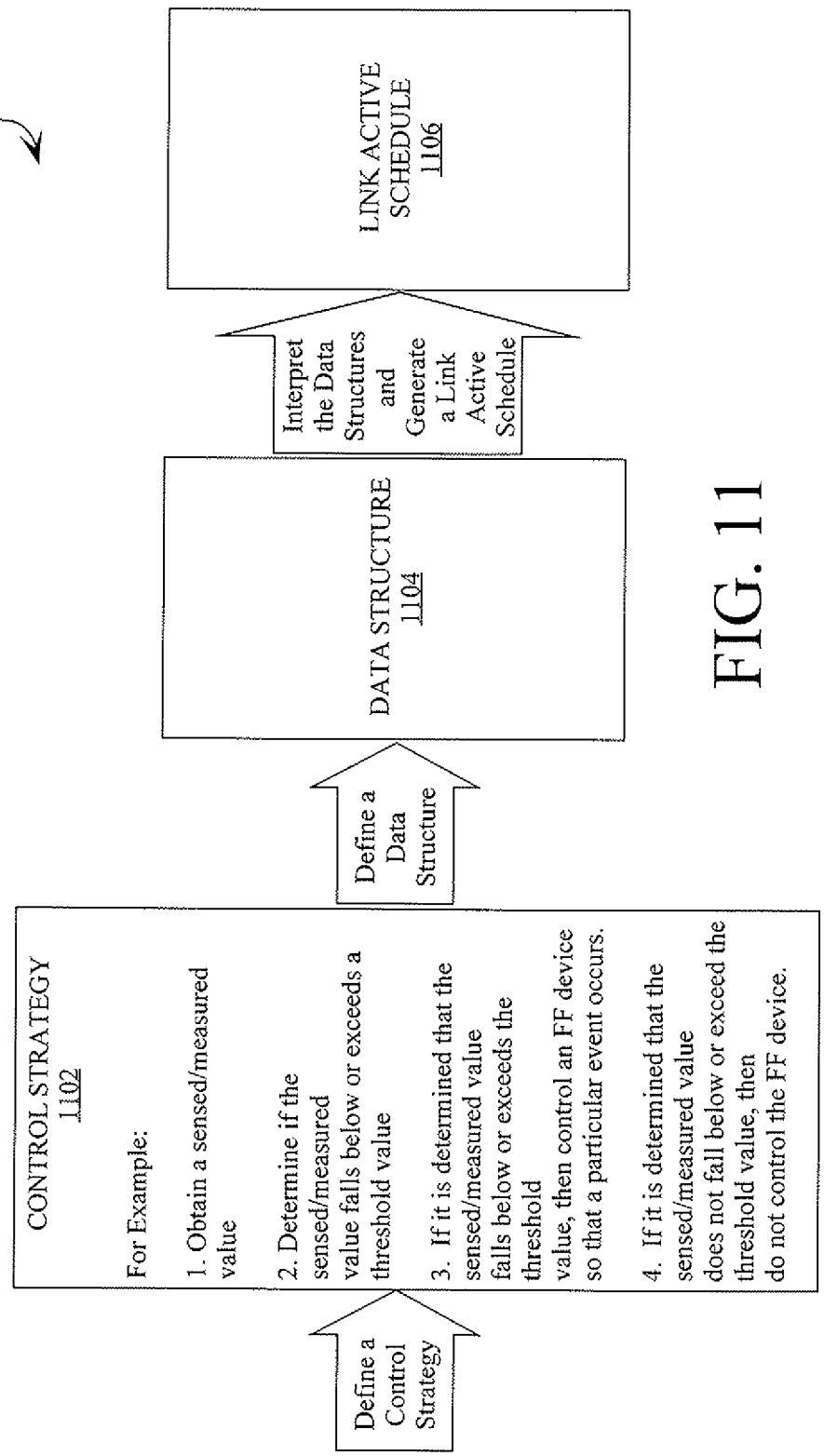
FIG. 11 is a schematic illustration of a process for creating a Link Active Schedule according to an embodiment of the invention.

As shown in FIG. 11, process 1100 begins with defining a control strategy 1102. As noted above, a control strategy 1102 is defined by a combination of events designed to facilitate the performance of an industrial process in accordance with a particular facility and/or government agency plan. More particularly, the control strategy 1102 can be defined by events for controlling FF devices and for interchanging data between controllers, FIMs, and/or FF devices. For example, the control strategy 1102 can be defined by a combination of events selected for: (1) obtaining a sensed/measured value from an FF device; (2) determining if the sensed/measured value falls below or exceeds a threshold value; and (3) controlling an FF device so that a particular event occurs if it is determined that the sensed/measured value falls below or exceeds a threshold value. The invention is not limited in this regard. The control strategy can be selected in accordance with a particular IPCS application.

Figure 12:
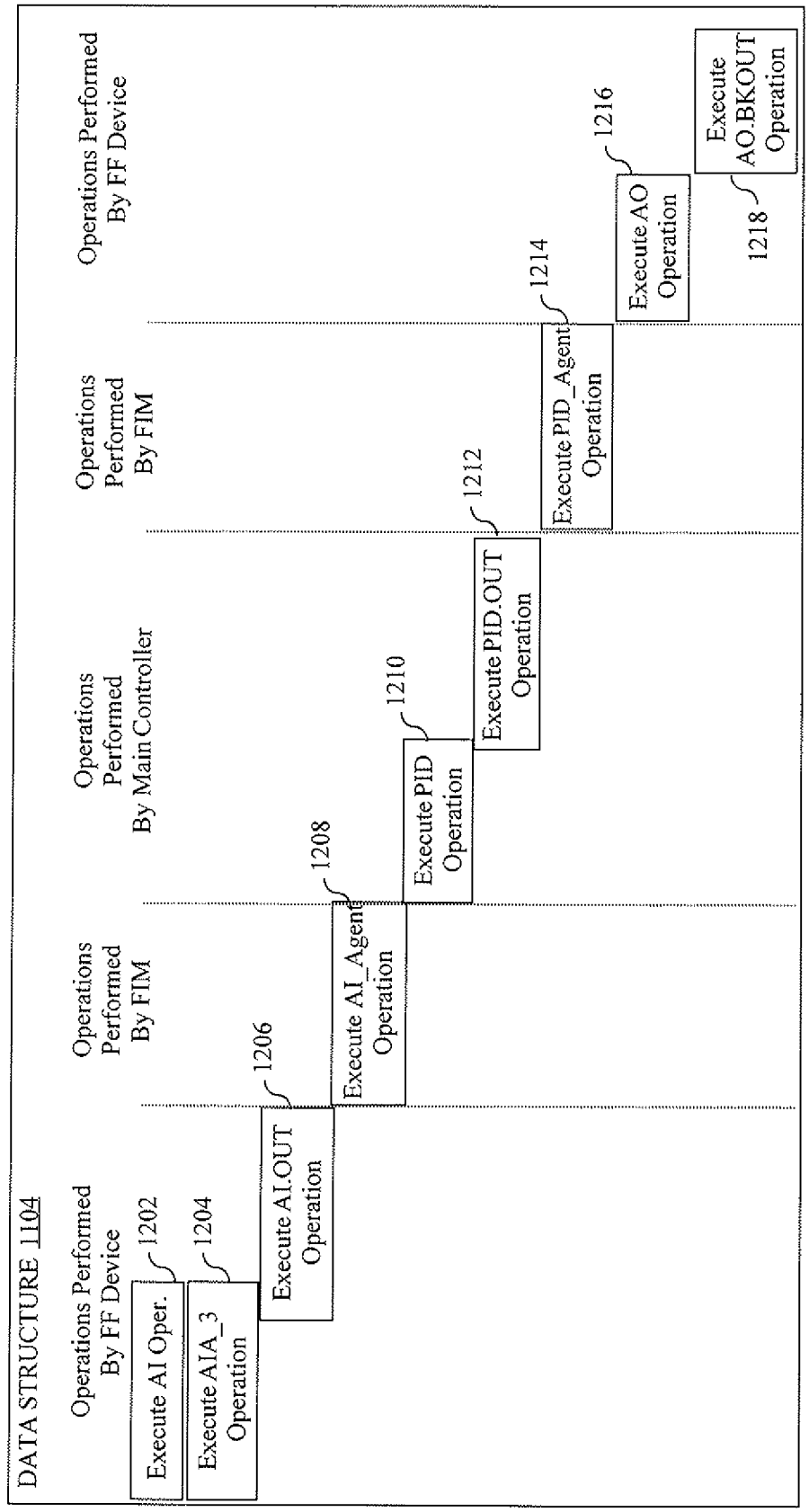
FIG. 12 is a schematic illustration of an exemplary data structure according to an embodiment of the invention.

Thereafter, process 1100 continues with defining a data structure 1104. Data structure 1104 is a representation of an implementation of the control strategy 1102. A schematic illustration of an exemplary data structure 1104 is provided in FIG. 12. As shown in FIG. 12, the exemplary data structure 1104 comprises a plurality of operational blocks 1202, . . . , 1218 representing operations of Fieldbus system devices (e.g., a main controller, a FIM, and a field device). The operational blocks 1202, . . . , 1218 are organized in an order of performance.

For example, a control strategy 1102 begins with the concurrent executions of an AI Operation (represented by operational block 1202) and an AIA_3 Operation (represented by operational block 1204) by an FF device. Prior to completing the AIA_3 Operation, the FF device begins performing an AI.OUT Operation (represented by operational block 1206). After the FF device completes the AI.OUT Operation, a FIM performs an AI_Agent Operation (represented by operational block 1208). Subsequent to completing the AI_Agent Operation, a main controller sequentially performs certain MC operations, such as an MC Operation (represented by operational block 1210) and an MC.OUT Operation (represented by operational block 1212). The MC Operations can involve reading a sensed/measured value from a CCN Buffer of a FIM, determining if the sensed/measured value falls below or exceeds a threshold value, and generating control data if it is determined that the sensed/measured value falls below or exceeds the threshold value. The MC.OUT Operation can involve writing the control data to a CCN Buffer of the main controller. Upon completing the MC and MC.OUT Operations, the FIM performs a PID_Agent Operation (represented by operational block 1214). Thereafter, the FF device performs an AO Operation (represented by operational block 1216) and an AO.BKOUT Operation (represented by operational block 1218). The invention is not limited in this regard. The data structure 1104 can be designed in accordance with any given control strategy.

Figure 13A:
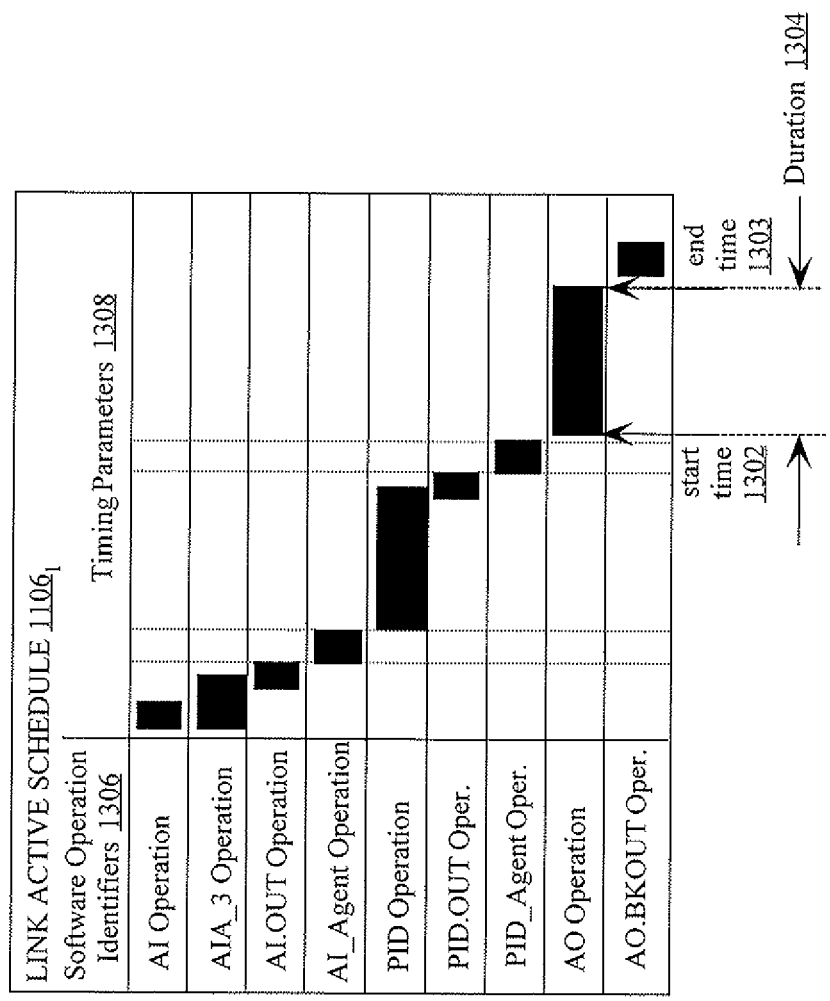

Referring again to FIG. 11, process 1100 continues with interpreting the data structure and generating Link Active Schedule 1106. Exemplary Link Active Schedules 1106$_1$, . . . , 1106$_3$ are provided in FIGS. 13A-13C. Referring now to FIG. 13A, the Link Active Schedule 1106$_1$ provides a way of storing data in a memory so that it can be used efficiently. The Link Active Schedule 1106$_1$ facilitates the simulation of a variety of operations performed by real FF devices and/or FIMs. The Link Active Schedule 1106$_1$ defines operations of a data structure 1104 in terms of time and order of performance. The Link Active Schedule 1106$_1$ can be implemented using (a) software operation identifiers 1306 for software implementations of device operations and (b) timing parameters 1308 for performing the software implementations. Each of the timing parameters can include a start time 1302 for performing a software implementation and/or the duration 1304 for performing the software implementation. As should be understood, the duration 1304 is bounded by the start time 1302 and an end time 1303.

Referring now to FIG. 13B, if at least one FF device and at least one FIM is to be simulated using simulation software, then the Link Active Schedule 1106$_2$ can include a scheduled waiting operation 1310. The waiting operation 1310 is provided so that a subsequent scheduled operation 1312 is not pre-maturely performed, i.e., so that the subsequent scheduled operation 1312 is not performed while a real main controller (or other real device) performs its scheduled operation(s). The invention is not limited in this regard. For example, the Link Active Schedule 1106$_2$ can be absent of the waiting operation 1310.

Referring now to FIG. 13C, if at least one FF device is to be simulated using simulation software, then the Link Active Schedule 1106$_3$ can include a plurality of scheduled waiting operations 1320, 1322, 1324. The scheduled waiting operations 1320, 1322, 1324 are provided so that a subsequent scheduled operation 1326 is not pre-maturely performed, i.e., so that the subsequent scheduled operation 1326 is not performed while a real main controller (or other real device) and a FIM perform their scheduled operation(s). The invention is not limited in this regard. For example, the Link Active Schedule 1106$_3$ can be absent of the waiting operations 1320, 1322, 1324.

Referring again to FIG. 8A, method 800 continues with step 812. In step 812, a plurality of simulation data records are generated using the data defining the simulation computer model (created in the previous step 804), the information obtained in the previous step 808, and the Link Active Schedule generated in the previous step 810. Thereafter, step 814 is performed where the simulation data records are stored in a database (e.g., database 204 of FIGS. 2A-2C). Subsequent to completing step 814, method 800 continues with step 816 of FIG. 8B.

Referring now to FIG. 8B, step 816 involves starting a simulation program installed on an ED/CSs (e.g., ED/CSs 222, 226 of FIG. 2A), a FIM (e.g, FIMs 232, 234 of FIG. 2B), and/or a simulation computer system (e.g., simulation computer system 242 of FIG. 2C). After the simulation program is started, steps 818 and 820 are performed. In steps 818 and 820, the simulation data records are loaded into a memory of the device (e.g., ED/CSs 222, 226 of FIG. 2A, FIMs 232, 234 of FIG. 2B, and simulation computer system 242 of FIG. 2C). In this regard, it should be understood that step 818 involves accessing the database and obtaining the simulation data records stored therein. Step 820 involves storing the simulation data records in a memory of the device (e.g., ED/CSs 222, 226 of FIG. 2A, FIMs 232, 234 of FIG. 2B, and simulation computer system 242 of FIG. 2C).

Subsequent to completing step 820, step 822 is performed where the simulation program is run to simulate the control strategy(ies) using the simulation computer model. The simulation program is configured to sequentially and/or concurrently perform functional block executions of software implementations of operations for at least one FIM and/or at least one FF device. As noted above, the software implementations are identified and scheduled in the Link Active Schedule(s). An exemplary functional block execution process performed by the simulation program will be described below in relation to FIGS. 14-15 and EXAMPLE 1. After step 822, step 824 is performed where simulation data is generated. The simulation data describes the operations of each functional block of the simulation computer model. Thereafter, step 826 is performed where method 800 ends.

Figure 14:
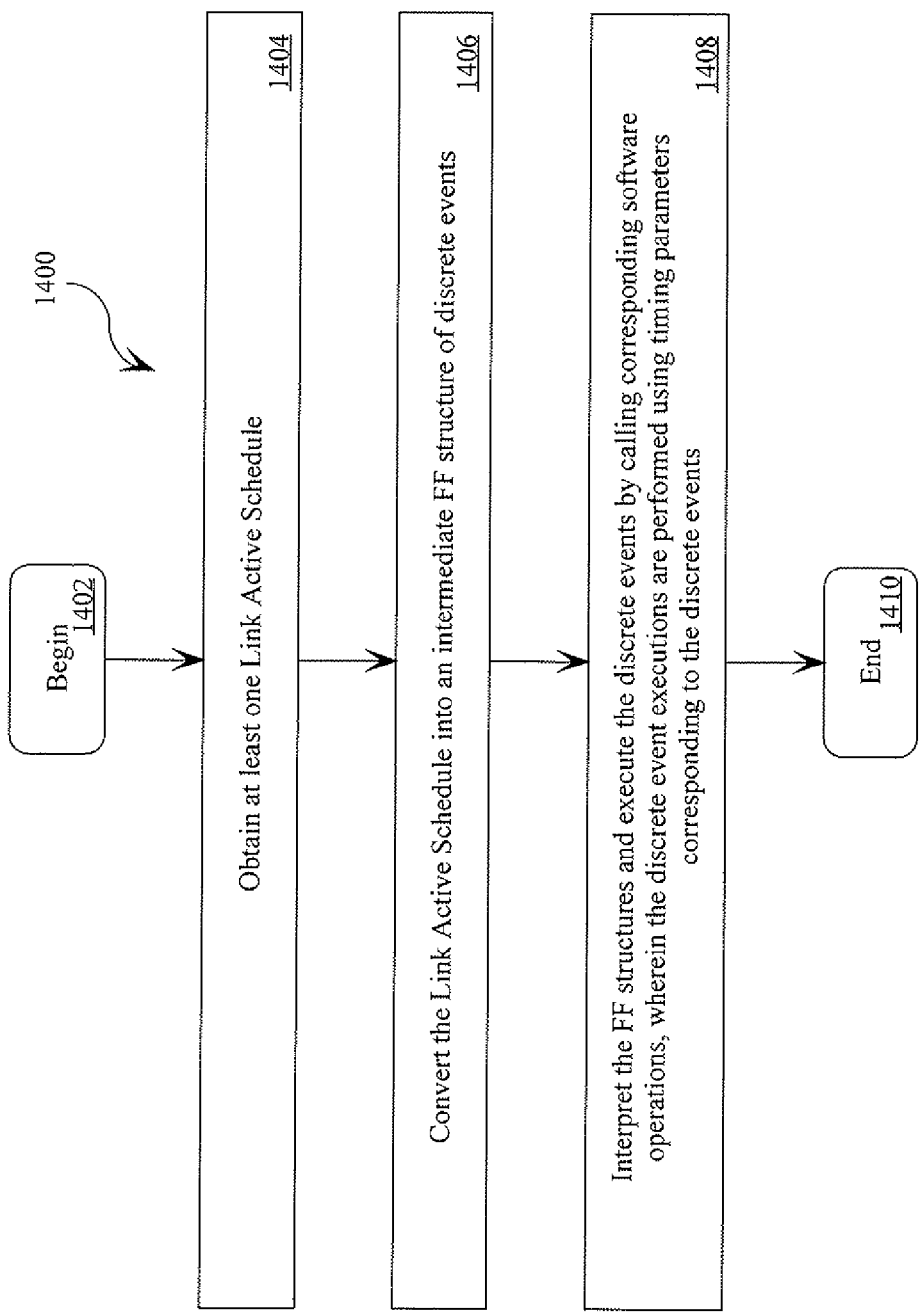
FIG. 14 is a flow diagram of an exemplary functional block execution process performed by the simulation program according to embodiments of the invention.
Figure 15:
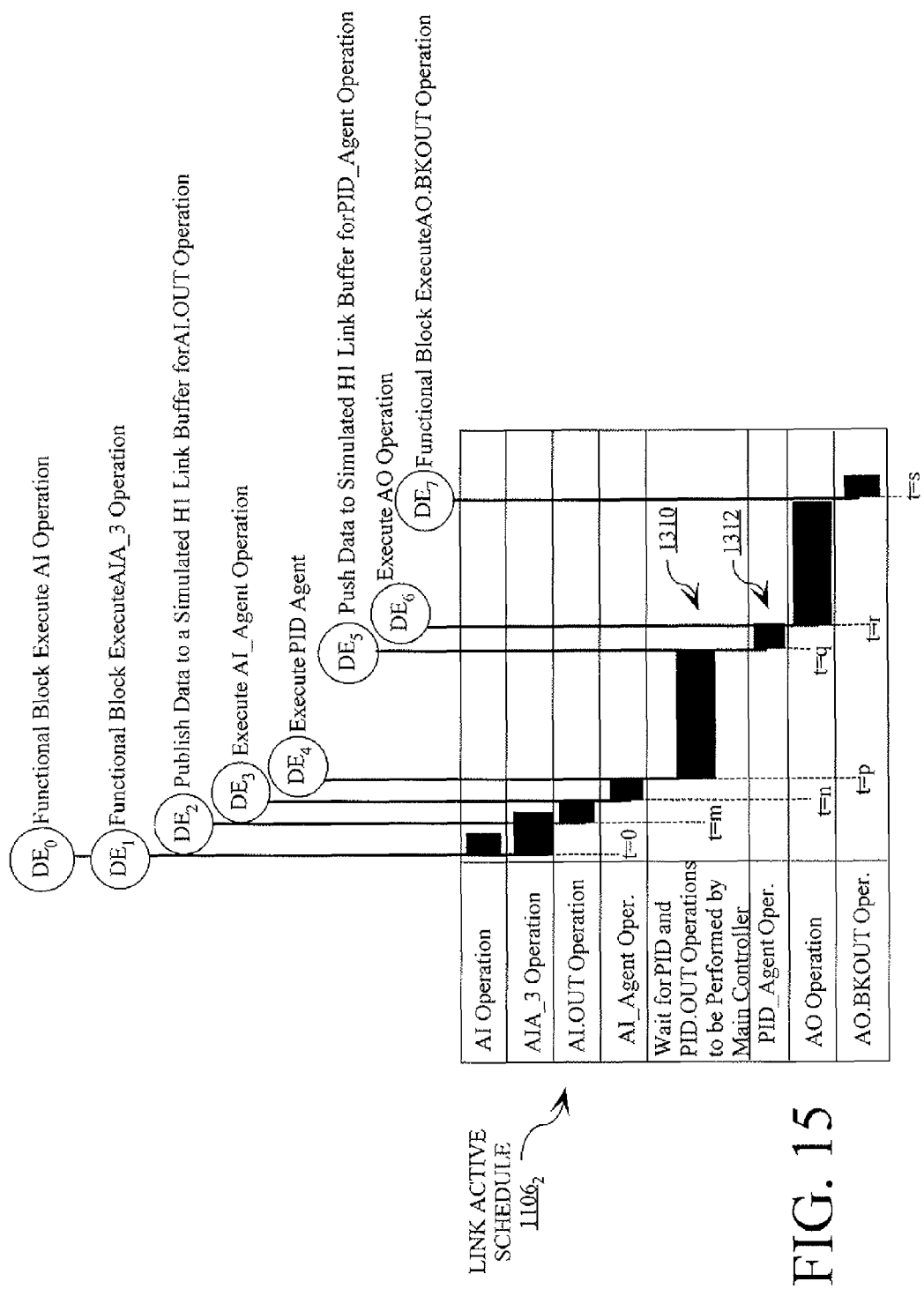
FIG. 15 is a schematic illustration of a Link Active Schedule and a corresponding intermediate FF structure according to embodiment of the invention.

Referring now to FIG. 14, there is provided a flow diagram of an exemplary functional block execution process 1400 performed by the simulation program. Process 1400 can be performed in step 822 of FIG. 8B. As shown in FIG. 14, the process 1400 begins with step 1402 and continues to step 1404. In step 1404, at least one Link Active Schedule is obtained. Thereafter, step 1406 is performed where the Link Active Schedule is converted to an intermediate FF structure. The intermediate FF structure comprises a plurality of discrete events. Step 1406 can be implemented by an event generator (not shown). The event generator can comprise hardware and/or software configured for converting Link Active Schedules into at least one intermediate FF structure. A schematic illustration of a Link Active Schedule $1106_2$ and a corresponding intermediate FF structure is provided in FIG. 15.

After completing step 1406, process 1400 continues with step 1408. In step 1408, the FF structure is interpreted and the discrete events are executed. The discrete events are executed by calling software operations for facilitating executions of the discrete events. Sets of events can include, but are not limited to, publishing data to a simulated H1 Link Buffer and pushing data to a simulated H1 Link Buffer. The discrete event executions are performed in accordance with the timing parameters corresponding to the discrete events. For example, first and second discrete events $DE_0$, $DE_1$ (shown in FIG. 15) are performed at time t=0. A third discrete event $DE_2$ (shown in FIG. 15) is performed at time t=m, and so on. After executing the discrete events, step 1410 is performed where process 1400 ends.

The following example is provided in order to further illustrate the present invention. The scope of the invention, however, is not to be considered limited in any way thereby.

Example 1

The following description of an exemplary functional block execution process performed by the simulation program assumes that the simulation computer model 900 of FIG. 9 and the Link Active Schedule $1106_2$ of FIG. 13B are utilized by the simulation program for simulating a control strategy 1102 of FIG. 11. In such a scenario, the following functional block executions will occur as defined by the Link Active Schedule $1106_2$:

(1) functional block 906 executions of AI Operation and AIA_3 Operation stating at time t=0 milliseconds;
(2) functional block 906 execution of AI.Out Operation at time t=m milliseconds;
(3) functional block 902 execution of AI_Agent Operation at time t=n milliseconds;
(4) wait a pre-defined period of time starting at time t=p;
(5) functional block 902 execution of PID_Agent Operation at time t=q milliseconds;
(6) functional block 906 execution of AO Operation at time t=r milliseconds; and
(7) functional block 906 execution of AO.BKOut Operation at time t=s milliseconds.

As a result of performing the above listed functional block executions, the control strategy 1102 is simulated by the simulation program.

In light of the forgoing description of the invention, it should be recognized that the present invention can be realized in hardware, software, or a combination of hardware and software. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

The present invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following: (a) conversion to another language, code or notation; (b) reproduction in a different material form. Additionally, the description above is intended by way of example only and is not intended to limit the present invention in any way, except as set forth in the following claims.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. A method for controlling a simulation being performed by a simulation system, said simulation regarding an operation of a Fieldbus system comprising at least one Fieldbus Interface Module (FIM) communicatively coupled to a plurality of field devices, comprising the steps of:
    initiating a current simulation of at least a portion of said operation of said Fieldbus system, wherein during a duration of said current simulation said Fieldbus system is exclusive of any real devices, said current simulation including a plurality of sequential steps involving said FIM, comprising;
    obtaining intermediate simulation information indicating a progress of said current simulation, said progress defining which steps of said plurality of sequential steps have been performed, are being performed, and are to be performed;
    communicating at least a portion of said intermediate simulation information to at least one user of said simulation system; and
    controlling said progress of said current simulation using at least one visual element of a computer display,
    wherein said current simulation is executed using at least one Link Active Schedule which defines a plurality of simulated functional block execution processes for said current simulation in terms of time and order of performance.

2. The method according to claim 1, further comprising the step of displaying a simulation computer model of a configuration of said Fieldbus system to said user, said simulation computer model comprising a plurality of functional blocks and a plurality of interconnections between said plurality of functional blocks, at least one functional block of said plurality of functional blocks representing said FIM.

3. The method according to claim 1, further comprising the step of displaying at least one Gantt chart on said computer display, said Gantt chart conveying information for said FIM or a field device of said plurality of field devices.

4. The method according to claim 1, further comprising the step of displaying visual content showing data exchanges between software elements and/or hardware elements of said simulation system.

5. The method according to claim 1, further comprising the step of speeding up said current simulation using said visual element.

6. The method according to claim 1, further comprising the step of slowing down said current simulation using said visual element.

7. The method according to claim 1, further comprising the step of moving said progress of said current simulation backwards using visual element.

8. The method according to claim 1, further comprising the step of moving said progress of said current simulation forwards using said visual element.

9. The method according to claim 1, further comprising the step of stopping said current simulation using said visual element.

10. The method according to claim 9, further comprising the step of re-starting said current simulation after said stopping using said visual element.

11. A simulation system for controlling a simulation regarding an operation of a Fieldbus system comprising at least one Fieldbus Interface Module (FIM) communicatively coupled to a plurality of field devices, comprising:
at least one computing device configured for initiating a current simulation of at least a portion of said operation of said at least one FIM, for obtaining intermediate simulation information indicating a progress of said current simulation, for communicating at least a portion of said intermediate simulation information to at least one user of said simulation system, and for displaying at least one visual element for controlling said progress of said current simulation to said at least one user, wherein during a duration of said current simulation said Fieldbus system is exclusive of any real devices;
wherein said current simulation comprises a plurality of sequential steps involving said FIM, and said progress defining which steps of said plurality of sequential steps have been performed, are being performed, and are to be performed,
wherein said current simulation is executed using at least one Link Active Schedule which defines a plurality of simulated functional block execution processes for said current simulation in terms of time and order of performance.

12. The simulation system according to claim 11, wherein said at least one computing device is further configured for displaying a simulation computer model of a Fieldbus system configuration to said at least one user, said simulation computer model comprising a plurality of functional blocks and a plurality of interconnections between said plurality of functional blocks, at least one function block of said plurality of functional blocks representing said FIM.

13. The simulation system according to claim 11, wherein said at least one computing device is further configured for displaying at least one Gantt chart to said at least one user, said Gantt chart conveying information for said at least one FIM or at least one field device of said plurality of field devices.

14. The simulation system according to claim 11, wherein said computing device is further configured for displaying visual content showing data exchanges between at least one of software elements and hardware elements of said simulation system.

15. The simulation system according to claim 11, wherein said visual element facilitates a user-software interactions for speeding up said current simulation.

16. The simulation system according to claim 11, wherein said visual element facilitates a user-software interaction for slowing down said current simulation.

17. The simulation system according to claim 11, wherein said visual element facilitates a user-software interaction for moving said progress of said current simulation backwards.

18. The simulation system according to claim 11, wherein said visual element facilitates a user-software interactions for moving said progress of said current simulation forwards.

19. The simulation system according to claim 11, wherein said visual element facilitates a user-software interactions for stopping said current simulation.

20. The simulation system according to claim 19, wherein said visual element facilitates a user-software interactions for re-starting said current simulation after said stopping.

* * * * *